United States Patent [19]

Schneider et al.

[11] Patent Number: 5,408,644
[45] Date of Patent: Apr. 18, 1995

[54] METHOD AND APPARATUS FOR IMPROVING THE PERFORMANCE OF PARTIAL STRIPE OPERATIONS IN A DISK ARRAY SUBSYSTEM

[75] Inventors: Randy D. Schneider, Spring; David L. Flower, Tomball, both of Tex.

[73] Assignee: Compaq Computer Corporation, Houston, Tex.

[21] Appl. No.: 894,067

[22] Filed: Jun. 5, 1992

[51] Int. Cl.⁶ ............................................. G06F 11/10
[52] U.S. Cl. ..................................... 395/575; 395/425
[58] Field of Search ............... 395/575, 250, 200, 775, 395/425

[56] References Cited

U.S. PATENT DOCUMENTS

| | | | |
|---|---|---|---|
| 4,423,479 | 12/1983 | Hanson et al. | 364/200 |
| 4,467,421 | 8/1984 | White | 364/200 |
| 4,775,978 | 10/1988 | Hartness | |
| 4,993,030 | 2/1991 | Krakauer et al. | |
| 5,014,237 | 5/1991 | Masters et al. | |
| 5,065,354 | 11/1991 | Jons et al. | 395/575 |
| 5,088,081 | 2/1992 | Farr | |
| 5,124,987 | 6/1992 | Milligan et al. | |
| 5,195,100 | 3/1993 | Katz et al. | 371/66 |
| 5,206,943 | 4/1993 | Callison et al. | |
| 5,297,258 | 3/1994 | Hale et al. | 395/275 |
| 5,333,305 | 7/1994 | Neufeld | 395/575 |

FOREIGN PATENT DOCUMENTS

| | | |
|---|---|---|
| 008688A3 | 8/1983 | European Pat. Off. |
| 0354579A2 | 2/1990 | European Pat. Off. |
| 0369707A2 | 5/1990 | European Pat. Off. |
| 91/16711 | 10/1991 | WIPO |
| 92/09035 | 5/1992 | WIPO |

OTHER PUBLICATIONS

Preventing Overflow In A Wraparound Buffer, IBM Technical Disclosure Bulletin, vol. 32, No. 11, Apr. 1990, pp. 81–82.
Evolution Of The DASD Storage Control, C. P. Grossman, IBM System Journal, vol. 28, No. 2, 1989, pp. 196–226.
Ciprico, Inc., Rimfire 6600 Parallel Disk Array Controller Data Sheets, Sep. 8, 1989.
Patterson, D. A., Gibson, G., Katz, R. H., "A Case For Redundant Arrays Of Inexpensive Disks (RAID)," Dec. 1987, pp. 1–24.
Storage Computer Corp., "RAID Aid: A Taxonomic Extension Of The Berkeley Disk Array Schema," Submitted At Data Storage Interface And Technology Conference IX, Disk Array Workshop, Technology Forums, Ltd., Sep. 1991 pp. 1–18.
Meador, W. E., Disk Array Systems, IEEE 1989, pp. 143–146.
NG. S., Some Design Issues Of Disk Arrays, 1989 pp. 137–142.

*Primary Examiner*—Robert W. Beausoliel, Jr.
*Assistant Examiner*—Norman M. Wright
*Attorney, Agent, or Firm*—Pravel, Hewitt Kimball & Krieger

[57] ABSTRACT

A posting memory used in conjunction with a drive array to increase the performance of fault tolerant disk array write operations. When the posting memory flushes dirty data back to the disk array, the posting memory coalesces or gathers contiguous small write or partial stripe write requests into larger, preferably full stripe writes. This reduces the number of extra read operations necessary to update parity information. In this manner, the actual number of reads and writes to the disk array to perform the transfer of write data to the disk array is greatly reduced. In addition, when the posting memory is full, the posting memory delays small, i.e., partial stripe writes but allows full stripe writes or greater to pass directly to the disk array. This reduces the frequency of partial stripe writes and increases disk array performance.

20 Claims, 28 Drawing Sheets

TRADITIONAL 3 + 1 MAPPING SCHEME

|  | DISK 0 | DISK 1 | DISK 2 | DISK 3 |
|---|---|---|---|---|
| STRIPE 0 | 0 | 4 | 8 | P0 |
|  | 1 | 5 | 9 | P1 |
|  | 2 | 6 | 10 | P2 |
|  | 3 | 7 | 11 | P3 |
| STRIPE 1 | 12 | 16 | 20 | P4 |
|  | 13 | 17 | 21 | P5 |
|  | 14 | 18 | 22 | P6 |
|  | 15 | 19 | 23 | P7 |
| STRIPE 2 | 24 | 28 | 41 | P8 |
|  | 25 | 29 | 42 | P9 |
|  | 26 | 30 | 43 | P10 |
|  | 27 | 40 | 44 | P11 |
| STRIPE 3 | 45 | 49 | 53 | P12 |
|  | 46 | 50 | 54 | P13 |
|  | 47 | 51 | 55 | P14 |
|  | 48 | 52 | 56 | P15 |
| STRIPE 4 | 57 | 61 | 65 | P16 |
|  | 58 | 62 | 66 | P17 |
|  | 59 | 63 | 67 | P18 |
|  | 60 | 64 | 68 | P19 |

PRIOR ART

FIG. 1

METHOD AND APPARATUS FOR IMPROVING THE PERFORMANCE OF PARTIAL STRIPE OPERATIONS IN A DISK ARRAY SUBSYSTEM

BACKGROUND OF THE INVENTION

1. Field of the Invention

The present invention is directed toward a method and apparatus for improving the performance of a disk array system in a computer system, and more particularly to a posted write memory used in conjunction with a disk array system to increase the efficiency of the disk array system.

2. Description of the Related Art

Personal computer systems have developed over the years and new uses are being discovered daily. The uses are varied and, as a result, have different requirements for various subsystems forming a complete computer system. With the increased performance of computer systems, mass storage subsystems, such as fixed disk drives, play an increasingly important role in the transfer of data to and from the computer system. In the past few years, a new trend in storage subsystems, referred to as a disk array subsystem, has emerged for improving data transfer performance, capacity, and reliability.

A number of reference articles on the design of disk arrays have been published in recent years. These include "Some Design Issues of Disk Arrays" by Spencer Ng April, 1989 IEEE; "Disk Array Systems" by Wes E. Meador, April, 1989 IEEE; and "A Case for Redundant Arrays of Inexpensive Disks (RAID)" by D. Patterson, G. Gibson and R. Catts, Report No. UCB/CSD 87/391, December, 1987, Computer Science Division, University of California, Berkeley, Calif.

One reason for building a disk array subsystem is to create a logical device that has a very high data transfer rate. This may be accomplished by "ganging" multiple standard disk drives together and transferring data to or from these drives in parallel. Accordingly, data is stored "across" each of the disks comprising the disk array so that each disk holds a portion of the data comprising a data file. If n drives are ganged together, then the effective data transfer rate may be increased up to n times. This technique, known as striping, originated in the supercomputing environment where the transfer of large amounts of data to and from secondary storage is a frequent requirement.

In striping, a sequential data block is broken into segments of a unit length, such as sector size, and sequential segments are written to sequential disk drives, not to sequential locations on a single disk drive. The combination of corresponding sequential data segments across each of the n disks in an array is referred to as a stripe. The unit length or amount of data that is stored "across" each individual disk is referred to as the stripe size. The stripe size affects data transfer characteristics and access times and is generally chosen to optimize data transfers to and from the disk array. If the data block is longer than n unit lengths, the process repeats for the next stripe location on the respective disk drives. With this approach, the n physical drives become a single logical device.

One technique that is used to provide for data protection and recovery in disk array subsystems is referred to as a parity scheme. In a parity scheme, data blocks being written to various drives within the array are used and a known EXCLUSIVE-OR (XOR) technique is used to create parity information which is written to a reserved or parity drive within the array. The advantage of a parity scheme is that it may be used to minimize the amount of data storage dedicated to data redundancy and recovery purposes within the array. For example, FIG. 1 illustrates a traditional 3+1 mapping scheme wherein three disks, disk 0, disk 1 and disk 2, are used for data storage, and one disk, disk 3, is used to store parity information. In FIG. 1, each rectangle enclosing a number or the letter "p" coupled with a number corresponds to a sector, which is preferably 512 bytes. As shown in FIG. 1, each complete stripe uses four sectors from each of disks 0, 1 and 2 for a total of 12 sectors of data storage per disk. Assuming a standard sector size of 512 bytes, the stripe size of each of these disk stripes, which is defined as the amount of storage allocated to a stripe on one of the disks comprising the stripe, is 2 kbytes (512×4). Thus each complete stripe, which includes the total of the portion of each of the disks allocated to a stripe, can store 6 kbytes of data. Disk 3 of each of the stripes is used to store parity information.

However, in addition to the advantages of parity techniques in data protection and recovery, there are a number of disadvantages to the use of parity fault tolerance techniques in disk array systems. One disadvantage is that traditional operating systems perform many small writes to the disk subsystem which are often smaller than the stripe of the disk array, referred to as partial stripe write operations. As discussed below, a large number of partial stripe write operations in conjunction with a parity redundancy scheme considerably reduces disk array performance.

Two very popular operating systems used in personal computer systems are MS-DOS (Microsoft disk operating system for use with IBM compatible personal computers) and UNIX. MS-DOS, or more simply DOS, is a single threaded software application, meaning that it can only perform one operation at a time. Therefore, when a host such as the system processor or a bus master performs a disk array write operation in a DOS system, the host is required to wait for a completion signal from the disk array before it is allowed to perform another operation, such as sending further write data to the disk array. In addition, in DOS, the quantity of data that can be transmitted to a disk array is relatively small, comprising a partial stripe write. Therefore, limitations imposed by DOS considerably reduce disk array performance because a large number of partial stripe writes are performed wherein the host must continually wait for the completion of each partial stripe write before instituting a new write operation.

UNIX also includes certain features which reduce disk array performance. More particularly, UNIX uses small data structures which represent the structure of files and directories in the free space within its file system. In the UNIX file system, this information is kept in a structure called an INODE (Index Node), which is generally two kilobytes in size. These structures are updated often, and since they are relatively small compared with typical data stripe sizes used in disk arrays, these result in a large number of partial stripe write operations.

Where a complete stripe of data is being written to the array, the parity information may be generated directly from the data being written to the drive array, and therefore no extra read of the disk stripe is required. However, as mentioned above, a problem occurs when the computer writes only a partial stripe to the disk array because the disk array controller does not have sufficient information from the data to be written to compute parity for the complete stripe. Thus, partial stripe write operations generally require that the data stored on the disk array first be read, modified by the process active on the host system to generate new parity, and written back to the same address on the data disk. This operation consists of a data disk READ, modification of the data, and a data disk WRITE to the same address. In addition to the time required to perform the actual operations, it will be appreciated that a READ operation followed by a WRITE operation to the same sector on a disk results in the loss of one disk revolution, or approximately 16.5 milliseconds for certain types of hard disk drives.

Therefore, in summary, when a large number of partial stripe write operations occur in a disk array, the performance of the disk subsystem is seriously impacted because the data or parity information currently on the disk must be read off of the disk in order to generate the new parity information. Either the remainder of the stripe that is not being written must be fetched or the existing parity information for the stripe must be read prior to the actual write of the information. This results in extra revolutions of the disk drive and causes delays in servicing the request. Accordingly, there exists a need for an improved method for performing disk array WRITE operations in a parity fault tolerant disk array in order to decrease the number of partial stripe write operations.

One technique for improving disk array system performance in general is the use of disk caching programs. In disk caching programs, an amount of main memory is utilized as a cache for disk data. Since the cache memory is significantly faster than the disk drive, greatly improved performance results when the desired data is present in the cache. While disk caching can be readily applied to read operations, it is significantly more difficult to utilize with write operations. A technique known as write posting saves the write data in the cache and returns an operation complete indicator before the data is actually written to the disks. Then, during a less active time, the data is actually written to the disk.

Background on write posting operations in computer systems is deemed appropriate. An example of write posting occurs when a microprocessor performs a write operation to a device where the write cycle must pass through an intermediary device, such as a cache system or posting memory. The processor executes the write cycle to the intermediary device with the expectation that the intermediary device will complete the write operation to the device being accessed. If the intermediary device includes write posting capability, the intermediary device latches the address and data of the write cycle and immediately returns a ready signal to the processor, indicating that the operation has completed. If the device being accessed is currently performing other operations, then the intermediary device, i.e., the posting memory, need not interrupt the device being accessed to complete the write operation, but rather can complete the operation at a later, more convenient time. In addition, if the device being accessed has a relatively slow access time, such as a disk drive, the processor need not wait for the access to actually complete before proceeding with further operations. In this manner, the processor is not delayed by the slow access times of the device being accessed nor is it required to interrupt other operations of the device being accessed. The data that has been written to the intermediary device or posting memory that has not yet been written to the device being accessed is referred to as dirty data. Data stored in the posting memory that has already been written to the device being accessed is referred to as clean data.

Therefore, when a posting memory is used in conjunction with a disk array subsystem, when a write request is received from a host, i.e., a processor or bus master, the data is written immediately to the posting memory and the host is notified that the operation has completed. Thus, the basic principal of a posted write operation is that the host receives an indication that the requested data has been recorded or received by the device being accessed without the data actually having been received by the device. The advantage is that the data from the host can be stored in the posted memory much more quickly than it can te recorded in the device being accessed, such as the disk array, thus resulting in a relatively quick response time for the write operation as perceived by the host. However, if the write operation is a partial stripe write, which is usually the case, then additional reads are still necessary to generate the required parity information when the data is transferred from the posting memory to the drive array. Therefore, a method and apparatus is desired to efficiently implement a posting memory in conjunction with a drive array system to reduce the percentage of partial stripe write operations as well as reduce the number of overall operations to the drive array and increase disk array performance.

Background on other data integrity methods is deemed appropriate. Other methods that are used to provide data protection and recovery are mirroring techniques for disk data and battery backup techniques for semiconductor memory. Mirroring techniques require that one disk drive be set aside for the storage of data as would normally be done, and a second equivalent disk drive is used to "mirror" or identically back up the data stored. This method insures that if the primary disk drive fails, the secondary or mirrored drive remains and can be used to recover the lost data. Battery backup techniques provide that if a power loss occurs to a memory system, the battery is enabled to maintain power for a period of time until an operator can ensure an orderly shutdown of the system.

SUMMARY OF THE INVENTION

The present invention relates to a posting memory in a disk array system that reduces the number of partial stripe write operations and increases the performance of disk array operations. The posting memory is coupled to both the disk array controller and the disk array. When a host such as a processor or bus master performs a write operation to the disk array, and the posting memory is not full, the write data is written into the posting memory, and the posting memory immediately returns a ready signal to the host. Due to seek delays and rotational latency of the disk array system, the storage time of data in the posting memory is much quicker than would be the storage in the disk array system. Therefore, a completion message is sent back to the host much more quickly than would occur if the data were written directly into the disk array, thus enabling the host to continue other operations.

When the posting memory writes or flushes the dirty data back to the disk array, the posting memory coalesces or gathers contiguous small write or partial stripe write requests into larger, preferably full stripe writes, thus reducing or eliminating the extra read operations necessary to update parity information. In this manner, the actual number of reads and writes to the disk array to perform the transfer of write data to the disk array is greatly reduced.

When the posting memory is full and a small write, preferably a partial stripe write, occurs to the disk array, the disk array controller delays posting or storing the write request, requiring that the write request be stored in the posting memory at a later time when the memory is not full. However, if a large write, preferably a full stripe or greater, occurs, and the posting memory is full, the disk array controller allows the write to pass directly to the disk array. A full stripe write operation is allowed to proceed because this operation will not require the preceding reads associated with a partial stripe write operation, and thus allowing this operation to proceed will not hamper disk array performance.

Therefore, a method and apparatus for increasing the performance of a disk array system is disclosed. The posting memory allows a completion signal to be immediately returned to the host, thus enabling the host to continue operations much more quickly than if the data were actually written to the much slower drive array. In addition, partial stripe writes within the posting memory are coalesced or gathered into full stripe writes, if possible, before the writes are actually performed to the disk array, thus reducing the frequency of partial stripe writes and increasing disk array performance. If the posting memory is full, then partial stripe writes are delayed for a period of time to prevent these operations from being performed directly to the array. However, write operations that comprise a full stripe write or greater are allowed to proceed to the drive array when the posting memory is full as these operations do not reduce system performance.

BRIEF DESCRIPTION OF THE DRAWINGS

A better understanding of the present invention can be obtained when the following detailed description of the specific embodiment is considered in conjunction with the following drawings, in which:

FIG. 1 is a prior art diagram of a traditional 3+1 disk array mapping scheme having a uniform stripe size;

DETAILED DESCRIPTION OF THE SPECIFIC EMBODIMENT

Figure 2:
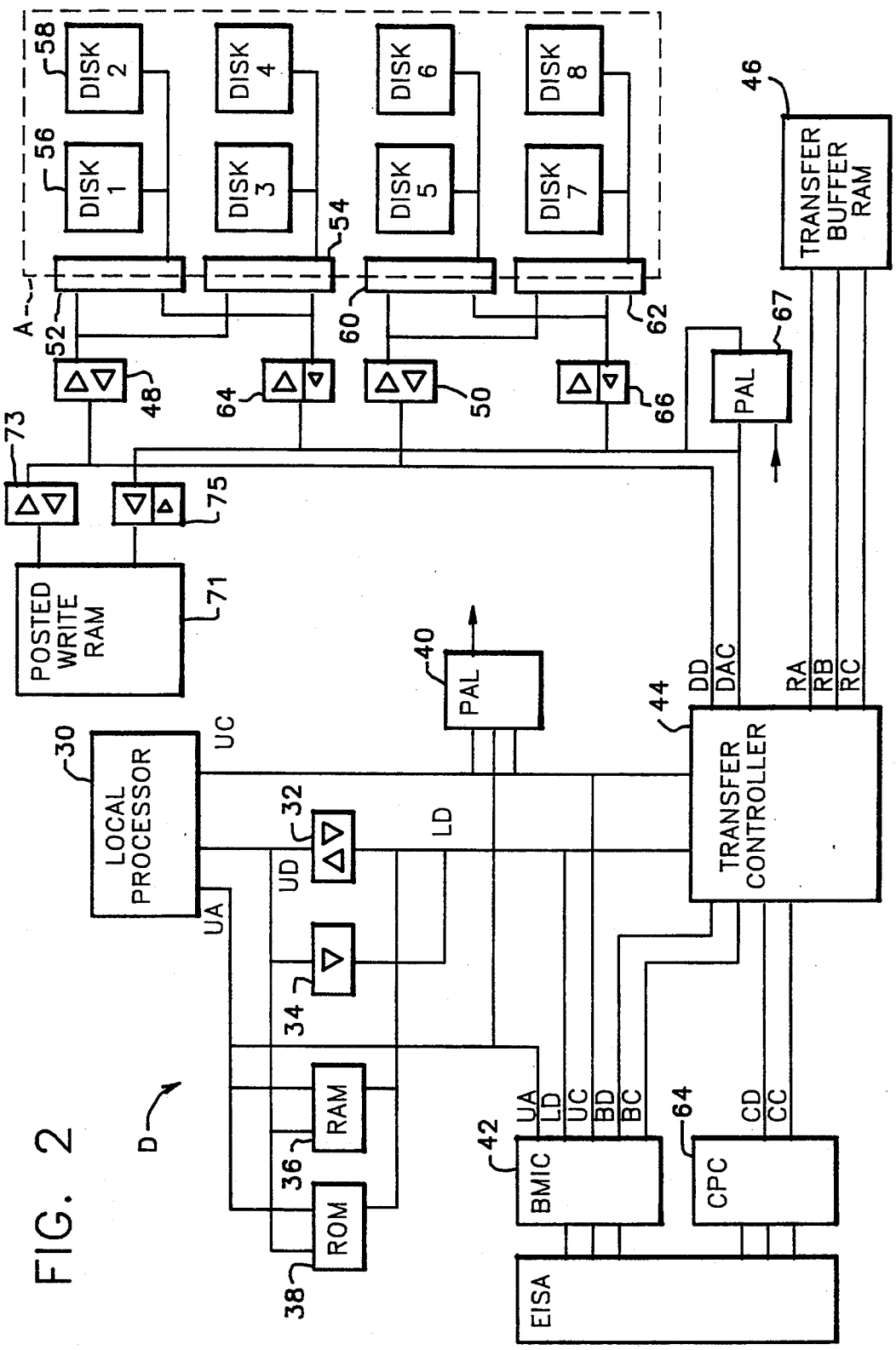
FIG. 2 is block diagram of a disk array system incorporating the present invention.

Referring now to FIG. 2, a disk array system including a disk array controller D incorporating the present invention and disk array A, is shown. The disk array system is preferably incorporated into a host system (not shown) which transfers and receives data to and from the drive array system. The disk array controller D has a local processor 30, preferably a V53 manufactured by NEC. The local processor 30 has a address bus UA, data bus UD and control outputs UC. The data bus UD is connected to a transceiver 32 whose output is the local data bus LD. The address bus UA is connected to the inputs of a buffer 34 whose outputs are also connected to the the local dta bus LD. The local processor 30 has associated with it random access memory (RAM) 36 coupled via the data bus UD and the address bus UA. The RAM 36 is connected to the processor control bus UC to develop proper timing signals. Similarly, read only memory (ROM) 38 is connected to the data bus UD, the processor address bus UA and the processor control bus UC. Thus the local processor 30 has its own resident memory to control its operation and for its data storage. A programmable array logic (PAL) device 40 is connected to the local processor control bus UC and the processor address bus UA to develop additional control signals utilized in the disk array controller D.

The local processor address bus UA, the local data bus LD and the local processor control bus UC are also connected to a bus master integrated controller (BMIC) 42. The BMIC 42 serves the function of interfacing the disk array controller D with a standard bus, such as the EISA or MCA bus and acting as a bus master. In the preferred embodiment the BMIC 42 is interfaced with the EISA bus and is the 82355 provided by Intel. Thus by this connection with the local processor buses UA and UC and the local data bus LD, the BMIC 42 can interface with the local processor 30 to allow data and control information to be passed between the host system and the local processor 30.

Additionally, the local data bus LD and local processor control bus UC are connected to a transfer controller 44. The transfer controller 44 is generally a specialized, multichannel direct memory access (DMA) controller used to transfer data between the transfer buffer RAM 46 and the various other devices present in the disk array controller D. For example, the transfer controller 44 is connected to the BMIC 42 by the BMIC data lines BD and the BMIC control lines BC. Over this interface the transfer controller 44 can transfer data from the transfer buffer RAM 46 through the transfer controller 44 to the BMIC 42 if a read operation is requested. If a write operation is requested data can be transferred from the BMIC 42 through the transfer controller 44 to the transfer buffer RAM 46. The transfer controller 44 can then pass this information from the transfer buffer RAM 46 to disk array A or to a posting memory referred to as the posted write RAM 71 (PW RAM).

The transfer controller 44 includes a disk data bus DD and a disk address and control bus DAC. The disk data bus DD is connected to transceivers 48 and 50. The disk address and control bus DAC is connected to two buffers 64 and 66 which are used for control signals between the transfer controller 44 and the disk array A. The outputs of the transceiver 48 and the buffer 64 are connected to two disk drive port connectors 52 and 54. These port connectors 52 and 54 are preferably developed according to the integrated device interface utilized for hard disk units. Two hard disks 56 and 58 can be connected to each connector 52 or 54. In a similar fashion, two connectors 60 and 62 are connected to the outputs of the transceiver 50 and the buffer 66, and two hard disks can be connected to each of the connectors 60 and 62. Thus, in the preferred embodiment, 8 disk drives can be connected or coupled to the transfer controller 44 to form the disk array A. In this way, the various data, address and control signal can pass between the transfer controller 44 and the particular disk drives 56 and 58, for example, in the disk array A. In the preferred embodiment, the disk array A has a stripe size of 16 sectors, wherein each sector comprises 512 bytes of data. In addition, in one embodiment, the 8 drives in the array A are organized as two four-drive arrays, for example, two 3+1 mapping schemes as previously described in FIG. 1. Other embodiments such as distributed parity, etc., may also be implemented.

A programmable array logic (PAL) device block 67 is connected to the disk address and control bus DAC and receives inputs from a control latch (not shown). The PAL block 67 is used to map in the PW RAM 71 as a disk drive as indicated by the control latch and map out an actual disk drive. For more information on the PAL block 67, the control latch, and other related circuitry, please see related copending application Ser. No. 07/894,734 entitled "Disk Drive Controller With a Posted Write Cache Memory," filed concurrently herewith, which is hereby incorporated by reference. A transceiver 73 and a buffer 75 are connected between the disk data bus DD and the disk address and control bus DAC, respectively, and the PW RAM 71 to allow data and control information to be passed between the transfer controller 44 and the PW RAM 71.

In the preferred embodiment a compatibility port controller 64 is also connected to the EISA bus. The compatibility port controller 64 is connected to the transfer controller 44 over the compatibility data lines CD and the compatibility control lines CC. The compatibility port controller 64 is provided so that software which was written for previous computer systems which do not have a disk array controller D and its BMIC 42, which is addressed over a EISA specific space and allows very high throughputs, can operate without requiring rewriting of the software. Thus the compatibility port controller 64 emulates the various control ports previously utilized in interfacing with hard disks.

Figure 3:
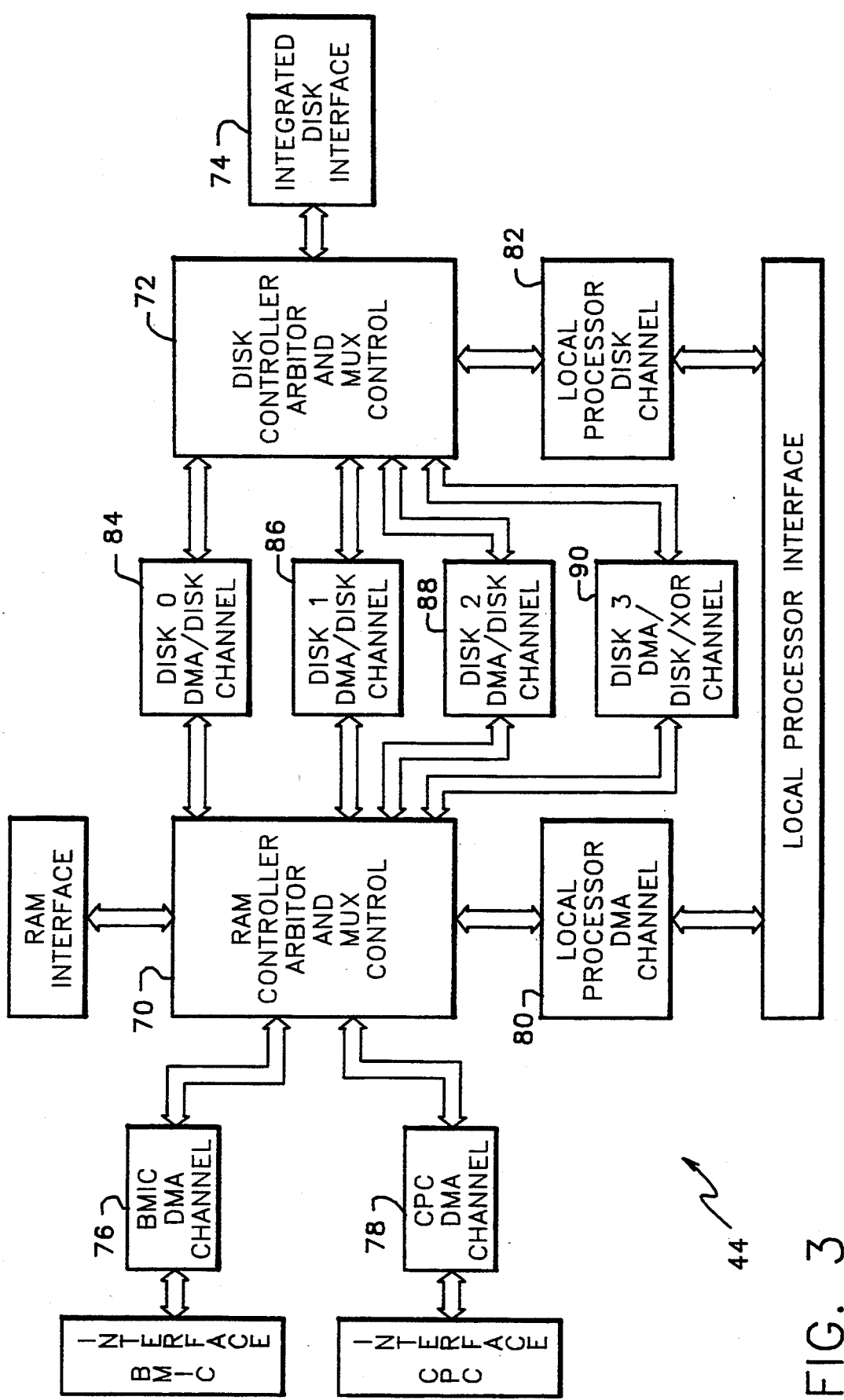
FIG. 3 is a block diagram of the transfer controller of FIG. 2.

The transfer controller 44 is itself comprised of a series of separate circuitry blocks as shown in FIG. 3. There are two main units in the transfer controller 44 and these are the RAM controller 70 and the disk controller 72. The RAM controller 70 has an arbiter to control which of the various interface devices have access to the RAM 46 (FIG. 2) and a multiplexer so that data can be passed to and from the buffer RAM 46. Likewise, the disk controller 72 includes an arbiter to determine which of the various devices has access to the integrated disk interface 74 and includes multiplexing capability to allow data to be properly transferred back and forth through the integrated disk interface 74.

There are basically seven DMA channels present in the transfer controller 44. One DMA channel 76 is assigned to cooperate with the BMIC 42. A second DMA channel 78 is designed to cooperate with the compatibility port controller 64. These two devices, the BMIC 42 and the compatibility port controller 64, are coupled only to the RAM 46 through their appropriate DMA channels 76 and 78 and the RAM controller 70. The BMIC 42 and the compatibility port controller 64 do not have direct access to the integrated disk interface 74 and the disk array A. The local processor 30 is connected to the RAM controller 70 through a local processor RAM channel 80 and connected to the disk controller 72 through a local processor disk channel 82. Thus the local processor 30 connects to both the buffer RAM 46 and the disk array A as desired.

Additionally, there are four DMA disk channels 84, 86, 88 and 90. These four channels 84–90 allow information to be independently and simultaneously passed between the disk array A and the RAM 46. It is noted that the fourth DMA/disk channel 90, preferably channel 3, also includes XOR capability so that parity operations can be readily performed in the transfer controller 44 without requiring computations by the local processor 30.

The computer system and disk array subsystem described below represent the preferred embodiment of the present invention. It is also contemplated that other computer systems, not having the capabilities of the system described below, may be used to practice the present invention.

Figure 4:
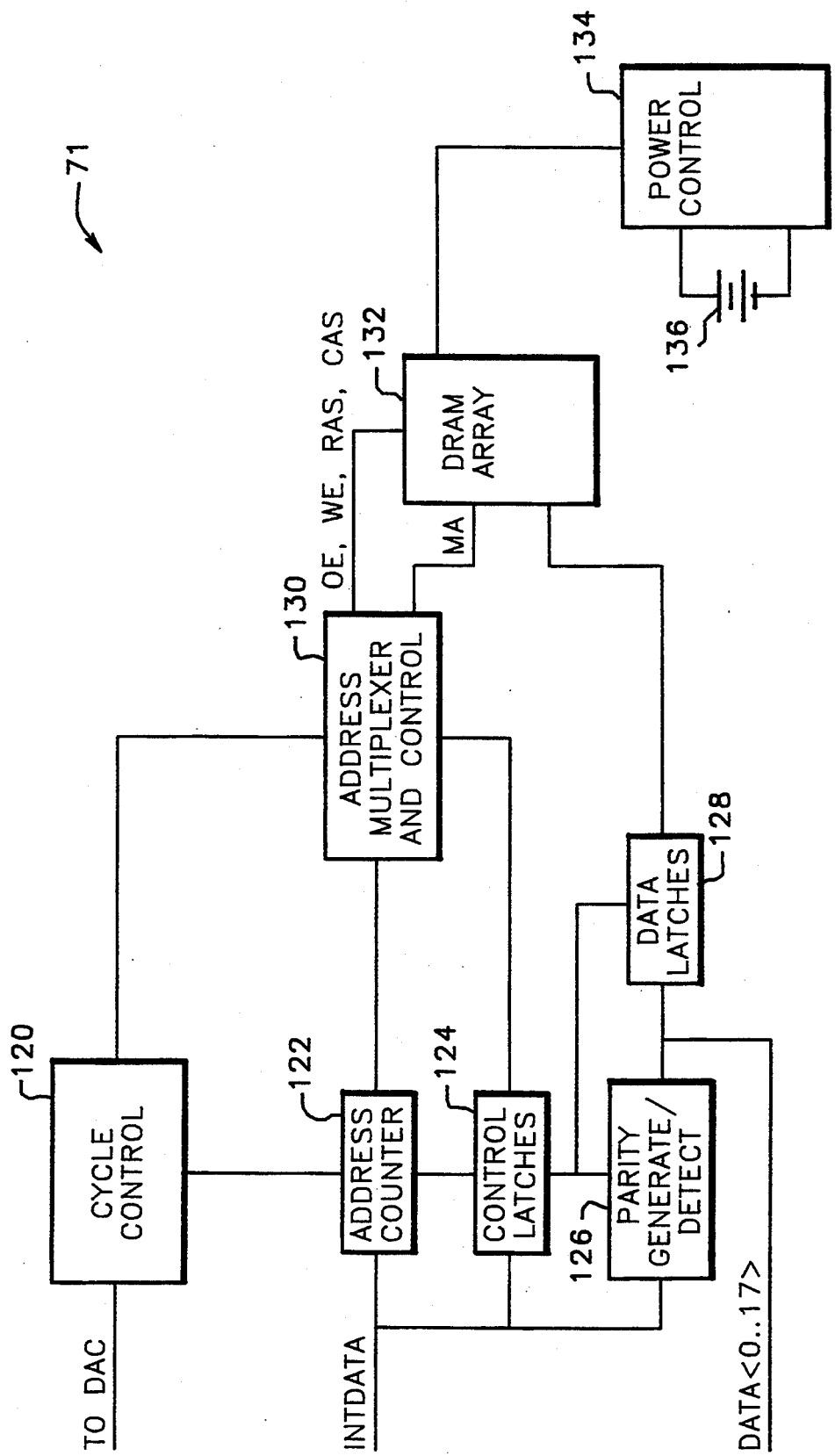
FIG. 4 is a block diagram of the posted write RAM of FIG. 2.

Referring now to FIG. 4, a block diagram of the posted write memory 71 is shown. A cycle control block 120 receives the various signals from the buffer 75 which are provided from the DAC bus. These are the signals sufficient to determine if particular cycles, such as the read/write cycles, are occurring and to return the various error, interrupt and other signals. The cycle control 120 provides outputs to an address counter 122, various control latches 124, a parity generator/detector transceiver 126 and to data latches 128. The address counter 122 is provided to allow latching and auto incrementing capabilities to allow block operations with the transfer controller 44 to occur easily. The control latches 124 are provided to allow the local processor 30 to set various states and conditions of the posted write memory 71. The parity generator/detector transceiver 126 is used to provide the parity detection for write operations and to develop an internal data bus in the posted write memory 71 referred to as the INTDATA bus.

The devices address counter 122, control latches 124, and the parity generator/detector transceiver 126 are connected to the INTDATA bus. The outputs of the address counter 122 and of the control latches 124 are provided to an address multiplexer and control block 130. The address multiplexer and control block 130 also receives outputs from the cycle control 120. The address multiplexer and control block 130 provides the output enable, write enable, row address select (RAS) and column address select (CAS) signals to a dynamic random access memory (DRAM) array 132 and provides the memory addresses to the DRAM array 132 over the MA bus. The data latches 128 provide the data to and from the DRAM array 132. The DRAM array 132 preferably is comprised of a mirrored bank of dynamic random access memories which also include sufficient capacity for parity checking. A power control block 134 is connected to a series of batteries 136 to provide battery power and to determine whether the batteries 136 or the power provided by the system is provided to the DRAM array 132.

Figure 5:
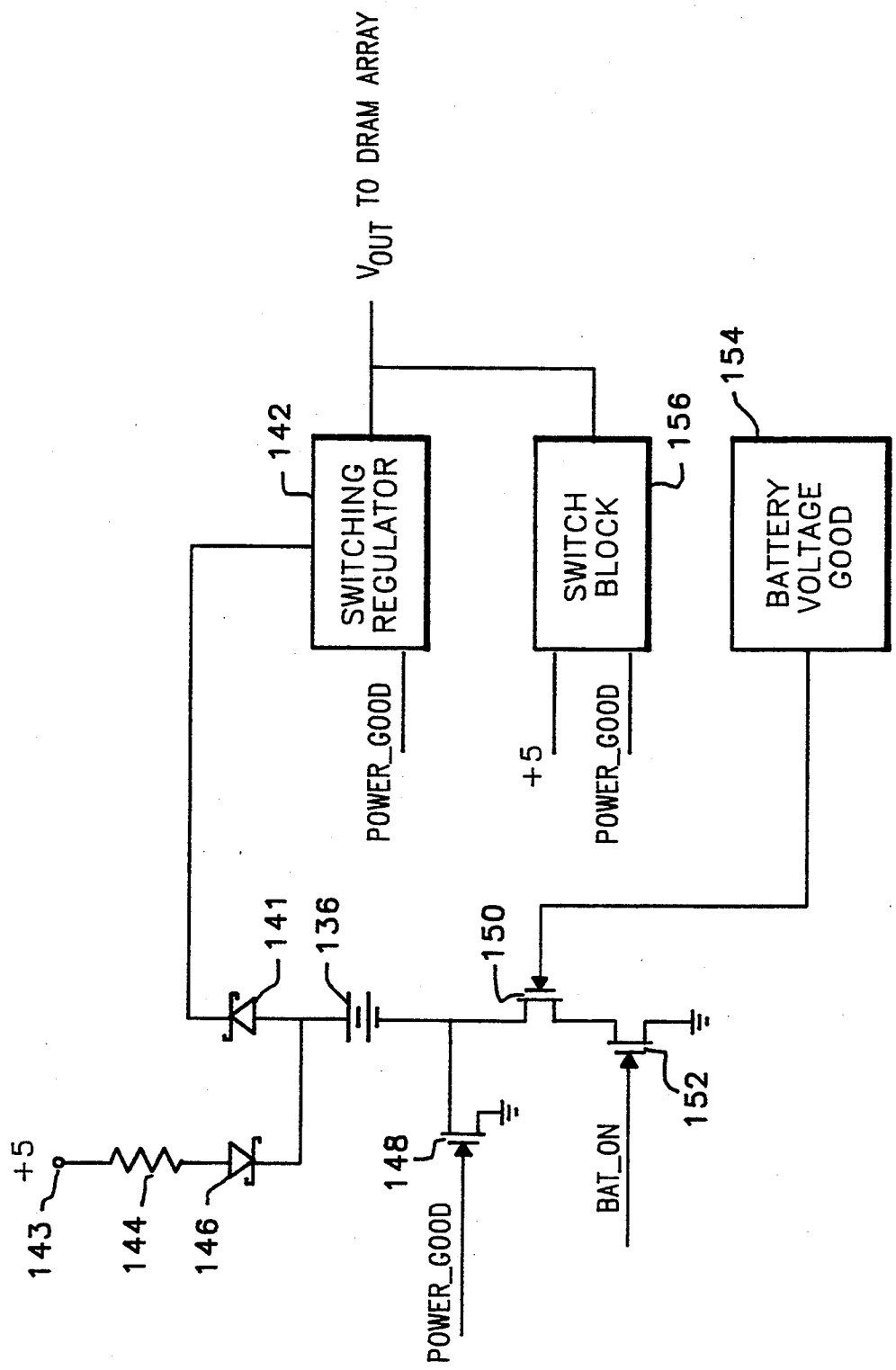
FIGS. 5 s a schematic diagram of the power control logic of FIG. 4.

Referring now to FIG. 5, the power control block includes the positive terminal of the batteries 136 connected to the anode of a Schottky diode 141. The cathode of the diode 141 is connected to the input of a switching regulator 142. A second input of the switching regulator 142 receives a signal referred to as POWER_GOOD, which indicates, when high, that the +5 volts being received by the disk controller D is satisfactory. The output of the switching regulator 142 is provided to a power input of the DRAM array 132 when the system power is not good. A +5 voltage signal and the POWER_GOOD signal are connected to switch block 156. The output of the switch block 156 is connected to the output of the switching regulator 142, which is provided to the DRAM array 132 in the PW RAM 71.

A +5 volt power supply 143 is connected through a resistor 144 to the anode of a Schottky diode 146 whose cathode is connected between the positive terminal of the batteries 134 and the anode of the diode 141. The POWER_GOOD signal is connected to the gate of an N-channel enhancement MOSFET 148 whose drain is connected to the negative terminal of the batteries 136 and whose source is connected to a logical ground.

The negative terminal of the batteries 136 is also connected to the drain of an N-channel enhancement MOSFET 150. The gate input of the MOSFET 150 receives a signal from a circuit referred to as battery voltage good 154, which monitors the battery voltage to determine if the batteries are fully discharged. The source of the MOSFET 150 is connected to the drain of an N-channel enhancement MOSFET 152 whose source is connected to ground. The gate input of the MOSFET 152 receives a signal referred to as BAT_ON, which indicates when high that the batteries 136 are available for backup power.

When adequate power is being provided to the DRAM array 132, the +5 voltage source 143 is provided and the POWER_GOOD signal is asserted, and the batteries 136 are charged from the 5 volt source 143 through the MOSFET 148. Also, when main power is operating, the switch block 156 provides the voltage source to the DRAM array 132. When main power to the DRAM array 132 is lost, the POWER_GOOD signal goes low and the +5 volt source 143 disappears. If the BAT_ON signal is asserted, indicating the batteries 136 are available and the battery voltage 73 satisfactory, a ground is provided to the negative terminal of the batteries 136 such that the batteries 136 provide power to the switching regulator 142 and out to the DRAM array 132. The negated POWER_GOOD signal to the switching regulator 142 causes the switching regulator 142 to provide the proper voltage to the DRAM array 132. If the BAT_ON signal is low, indicating the batteries 136 are not available or the battery voltage is too low, the DRAM array 132 is not powered when the system power is lost. This extends the life of the batteries.

PW RAM Description

The data contained in DRAM array 132 in the PW RAM 71 is preferably organized in a manner similar to a 15-way cache and utilizes a true last recently used (LRU) replacement algorithm. However, the cache only caches on write operations and does not cache reads from the disk array A. In at least this manner, operation is different from a conventional disk cache, which primarily caches reads. When the host generates a read operation or command list to the drive array A, the controller D first checks to see if the requested data resides in the DRAM array 132 in the PW RAM 71. If so, the data is returned from the PW RAM 71, and the drive array A is not accessed. If the data does not reside in the PW RAM 71, then the data is retrieved from the drive array A. If the PW RAM 71 were operating as a true cache system, the data obtained from the drive array A would be written into the DRAM array 132 in the PW RAM 71 as well as being provided to the requesting host. However, the PW RAM 71 in the preferred embodiment does not cache or store data on read misses and therefore does not operate as a true cache system.

When the PW RAM 71 is not full, the PW RAM 71 stores or posts write data from the host into the DRAM array 132. The PW RAM 71 writes or flushes this data to the drive array A at a later time. The PW RAM 71 also coalesces or gathers contiguous small or partial stripe writes into full stripe writes before flushing the write data to the drive array A according to the present invention. This reduces the number of partial stripe writes, thus increasing disk array performance. When the PW RAM 71 is full, write operations smaller than a given size, preferably less than a full stripe write, are delayed from being posted until the PW RAM 71 has sufficient room available. However, write requests greater than a given size, preferably a full stripe write or greater, are allowed to proceed directly to the drive array A.

In the preferred embodiment, the disk array A may be partitioned into a plurality of logical volumes. Also in the preferred embodiment, the capability of posting writes may be enabled on a logical volume basis with a command referred to as the "set posted writes" command from the BMIC 42. When a plurality of logical volumes are established, the PW RAM 71 is preferably comprised of data areas that are available to each of the logical volumes on a first come, first serve manner. In the preferred embodiment, each of the logical volumes that are configured for posted writes are required to have the same stripe size or distribution factor.

The DRAM array 132 in the PW RAM 71 includes an area where write data is stored and an area in which corresponding status information regarding the various write data is stored. The write data area includes a plurality of lines of data where each line comprises 16 sectors of data. As previously noted, 16 sectors is also preferably the stripe size in the disk array A. Therefore, one line in the PW RAM 71 holds a portion of a stripe residing on one disk in the array A. Three lines of data in the PW RAM 71 comprise an entire stripe of data in the disk array A. As previously noted, the PW RAM 71 does not store parity data.

The local processor RAM 36 stores status information regarding respective lines in the PW RAM 71. The status information stored in the RAM 36 includes a tag which stores the upper address bits of the data in the PW RAM line. As in a cache memory, the lower address bits are dictated by the location of the line in the respective way. The status information also includes a 16 bit word referred to as the dirty word wherein each bit indicates whether the corresponding sector in the line is clean or dirty, and a word referred to as the valid word wherein each bit indicates whether the corresponding sector in the line is valid or invalid. The status information further includes information regarding whether the line is locked and the reason for which the line is locked. A line is locked when it is currently being flushed to the disk array A or is waiting to receive write data from the host. Other types of status information in the RAM 36 associated with each line include the destination of the associated data in the line, including the logical volume, the drive, and the location in the respective stripe. The status information area in the PW RAM 71 stores a copy of certain status information held in the local processor RAM 36, including the tag, volume number, and dirty word. As discussed further below, a low priority software task continually scans the status information in the RAM 36 associated with each line, determines whether the line contains dirty data, coalesces partial stripe writes into full stripe writes, if possible, and flushes the write data to the drive array A. The operation of this task is discussed more fully below.

Use of the PW RAM 71 introduces another level of catastrophic failure into the disk array system. For example, problems may arise if the primary power fails while there is dirty data within the PW RAM 71. Therefore, as previously discussed, the PW RAM 71 includes battery back-up techniques wherein batteries are available to provide power if the main power fails. Logic is also included to restore dirty data from the PW RAM 71 upon power-up after the failure of a previous system. For more information on these battery backup and data restoration techniques, please see related copending application Ser. No. 07/894,111, entitled "Method and Apparatus for Maintaining and Retrieving Live Data in a Posted Write Cache in Case of Power Failure," filed concurrently herewith, which is hereby incorporated by reference.

In addition to the battery backup techniques discussed above, the PW RAM 71 includes optional data integrity techniques such as mirroring and parity checking. Parity checking allows determination of errors prior to the actual storage of data on the drive. When an error is obtained, the mirroring feature allows access to an exact copy of the data so that valid data is still available for storage by the disk drive. The combination of battery backup, mirroring, and parity checking provides the PW RAM 71 with sufficient data security to allow use in even very critical environments. For more information on these techniques, please see related copending application Ser. No. 07/894,734, entitled "Disk Drive Controller With a Posted Write Cache Memory," filed concurrently herewith, which is hereby incorporated by reference.

The method of the present invention is preferably implemented as a number of application tasks running on the local processor 30 (FIG. 2). Because of the nature of interactive input/output operations, it is impractical for the present invention to operate as a single batch task on the local processor 30. Accordingly, the local processor 30 utilizes a real time multitasking system which permits multiple tasks to be addressed by the local processor 30, including the present invention. Preferably, the operating system on the local processor 30 is the AMX86 Multitasking Executive by Kadak Products Limited. The AMX operating system kernel provides a number of system services in addition to the applications set forth in the method of the present invention.

In the preferred embodiment, a host such as a microprocessor or a bus master submits a command list 190 (FIG. 6) to the disk array controller D through the BMIC 42. A command list may be a simple read or write request directed to the disk array A, or it may be a more elaborate set of requests containing multiple read/write or diagnostic and configuration requests. The local processor 30, on receiving this command list through the BMIC 42, parses the command list into one or more logical requests. Logical requests essentially have the same structure as the command list 190, but whereas a command list may include multiple reads or writes, each logical request includes only one read or one write. The logical request is then submitted to the local processor 30 for processing. A plurality of software tasks operating on the local processor 30 oversee the execution of the logical request, including the transferring of data. Once the execution of the each of the logical requests comprising the command list is complete, the local processor 30 notifies the operating system device driver.

Figure 6:
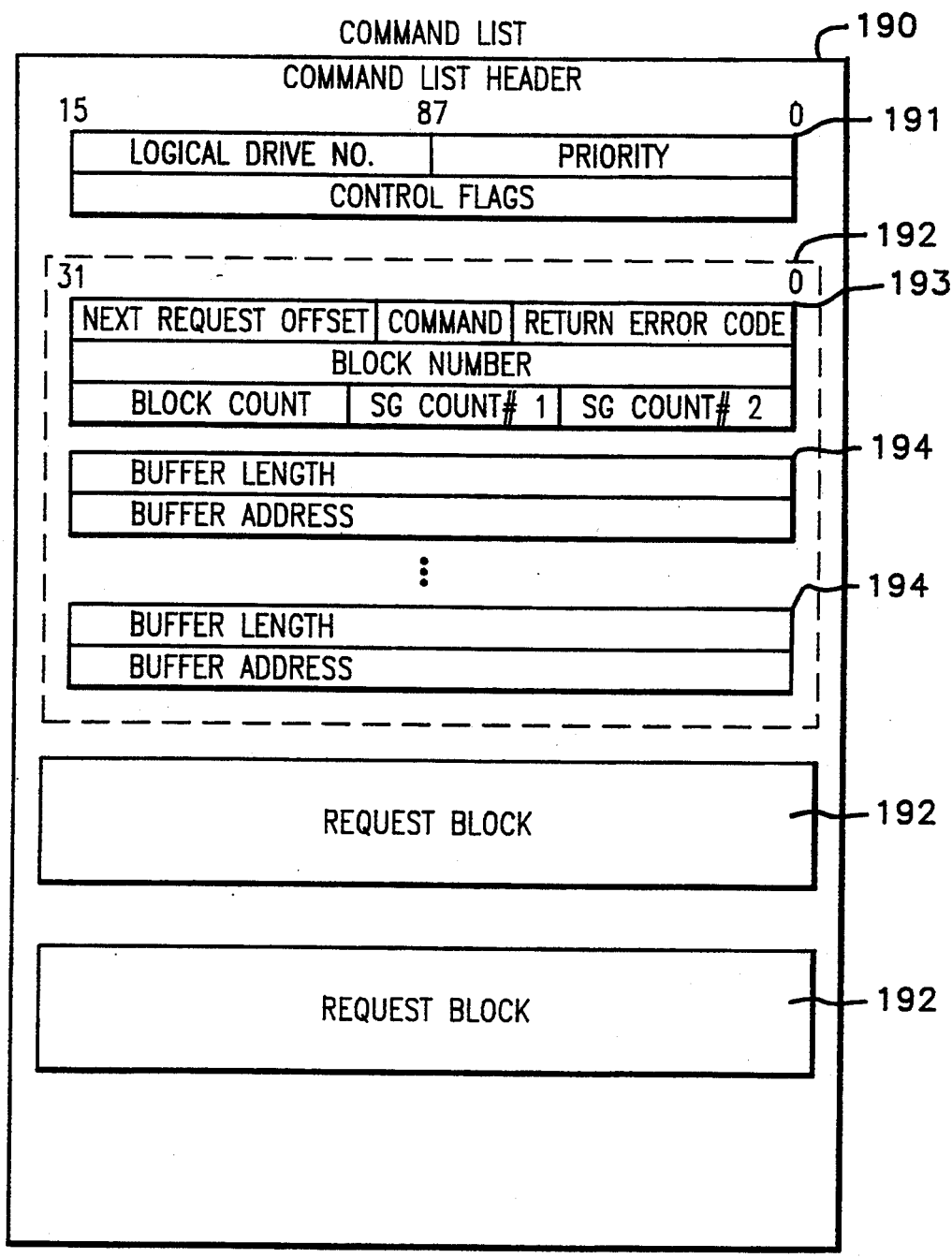
FIG. 6 illustrates a command list generated by a host to the drive array.

Referring now to FIG. 6, a command list 190 comprises a command list header 191, followed by a variable number of request blocks 192. The request blocks are variable in length and may be any combination of I/O requests. The command list header 191 includes data that applies to all request blocks 192 in a given command list 190, including logical drive number, priority and control flags. The logical drive number specifies the respective logical drive destination for all request blocks 192 within the command list 190.

The priority byte is used to provide control over the processing of a command list. The disk array controller D is capable of operating upon many command lists concurrently, and a specified priority permits a command list to be processed prior to those already scheduled for processing by the disk array controller D. The control flags are used for error processing and for the ordering of logical requests which have the same priority.

The individual request blocks 192 each represent an individual I/O request. By forming a command list 190 out of several individual request blocks, and submitting the command list 190 to the disk array controller D (FIG. 2), host overhead is reduced. A request block 192 is comprised of two parts, a fixed length request header 193 and a variable length parameter list 194.

Each request header field 193 includes a link to the next request block 192, referred to as next request offset, the type of I/O command, space for a return status, a block or sector address, a block or sector count, and a count of scatter/gather descriptor structure elements for two S/G structures. The request header is a total of 12 bytes in length.

The next request offset block is provided to allow the disk array controlled D to quickly and efficiently traverse the list of variable request blocks 192. The next request offset block comprises a pointer which specifies an offset of "n" bytes from the current address to the next request block. This field makes the command list 190 a set of linked list logical requests 192. The last request block 192 has a value of 000h in the next request offset to signify the end of the command list 190.

The parameters in the parameter list 194 are created as data structures known as scatter/gather (S/G) descriptors, which define system memory 58 data transfer addresses. The scatter/gather descriptor counters in each request header 193 are used to designate the number of scatter/gather descriptors 194 which are utilized in the particular request. The number of scatter/gather descriptors 194 associated with the request block 192 will vary. Further, if the command is a read command, the request may contain up to two different sets of scatter/gather descriptors. Each scatter/gather descriptor 194 contains a 32 bit buffer length and a 32 bit address. This information is used to determine the system memory data transfer address which will be the source or destination of the data transfer. Unlike the request blocks 192 in the command list, the scatter/gather descriptors must be contiguous and, if there exists a second scatter/gather descriptor set for a request, it must directly follow the first set of scatter/gather descriptors. The command block in the request header 193 specifies the function of the particular request block and implies the format of the parameter list.

The submission of the command list and the notification of a command list completion are achieved by a protocol which uses I/O registers (not shown) in the BMIC 42. To allow multiple outstanding requests to the disk array controller D, these I/O registers utilize two channels: a command list submit channel and a command list complete channel. For a more complete description of the submission of a command list to the drive array controller, please see U.S. Pat. No. 5,101,492 to Stevens et al, which is hereby incorporated by reference.

BRIEF OVERVIEW OF THE EXECUTION OF A COMMAND LIST

A brief overview of the manner in which a command list from the host is executed by the drive array controller D to access data in the drive array A according to the preferred embodiment of the invention is deemed appropriate. As previously mentioned, when the host generates a command list to the controller D, the local processor 30 parses the command list into one or more logical requests. A task referred to as the mapper task examines the logical requests and organizes the logical requests into a plurality of physical drive request lists for the individual drives. On write requests, the mapper task also determines if the PW RAM 71 is full and, if so, the task enables write posting for logical requests that are smaller than a given size, smaller than a full stripe write in the preferred embodiment, and disables posting for logical requests greater than a given size, which is greater than or equal to a full stripe write in the preferred embodiment. This prevents more burdensome partial stripe writes from having direct access to the disk array A while allowing less burdensome full stripe writes to be performed directly to the array A.

Once the mapper task has broken up the logical requests into a plurality of individual drive request lists, a task referred to as the scheduler task examines each request list, marking each request as a read hit, read miss, posted write, or drive array write. The scheduler task then splits up the request lists into individual drive queues for each of the drives, including the PW RAM 71. The scheduler task also "kicks off" or initiates transfer of the read requests at the head of each of the drive queues if the respective drive queue was previously empty. The scheduler task also invokes a task referred to as the transfer task (not shown) which initiates host data transfers for each of the write requests. When the host write data is received, the transfer task initiates transfer of this write data to its respective destination, either the PW RAM 71 or the drive array A.

A task referred to as post processor handles post processing of each request such as status updates in the PW RAM 71. A task referred to as the dequeue task is responsible for initiating the remaining transfers in each of the drive queues after the scheduler task has initiated the request at the head of each of the queues. If a DMA channel of the transfer controller 44 is not ready for a request at the head of a drive queue, the dequeue task places this request in one of two channel queues and then examines the next request. The post processor task initiates transfers of the requests in the channel queues.

A task referred to as the flush task continually scans through the PW RAM 71 searching for dirty data to flush to the drive array A. The flush task coalesces partial stripe writes into full stripe writes, if possible, and generates logical requests similar to logical requests created by the host. Logical requests created by the flush task are processed through the mapper, scheduler, and post processor tasks in a manner similar to that of a host generated logical request. By coalescing partial stripe writes into full stripe writes, the number of actual operations to the drive array A is reduced, resulting in greater system efficiency.

In the preferred embodiment, the flush task generates a logical write request regardless of whether the task was successful in coalescing partial stripe writes into a larger write. In an alternate embodiment, the flush task does not generate a logical write request until it has been successful in coalescing partial stripe writes into a full stripe write or greater, unless a flush is required for other reasons, such as if the PW RAM 71 is full or a line needs to be replaced.

MAPPER TASK

Figure 7A:
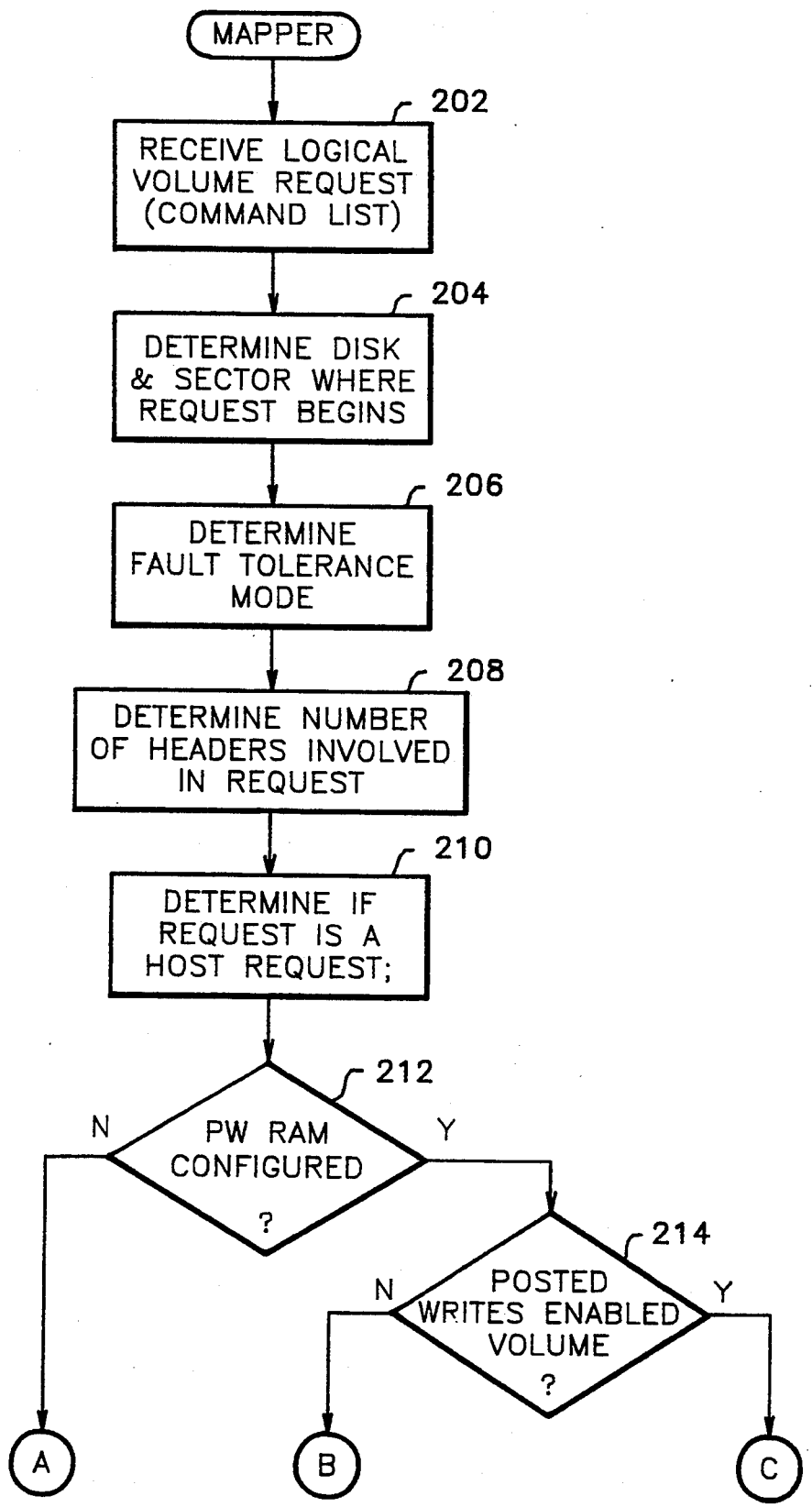
FIGS. 7A–7C, 8A–8F, 9A–9D, 10, and 11A–11G are flow chart diagrams illustrating various software tasks operating in the disk array system of FIG. 2.
Figure 7B:
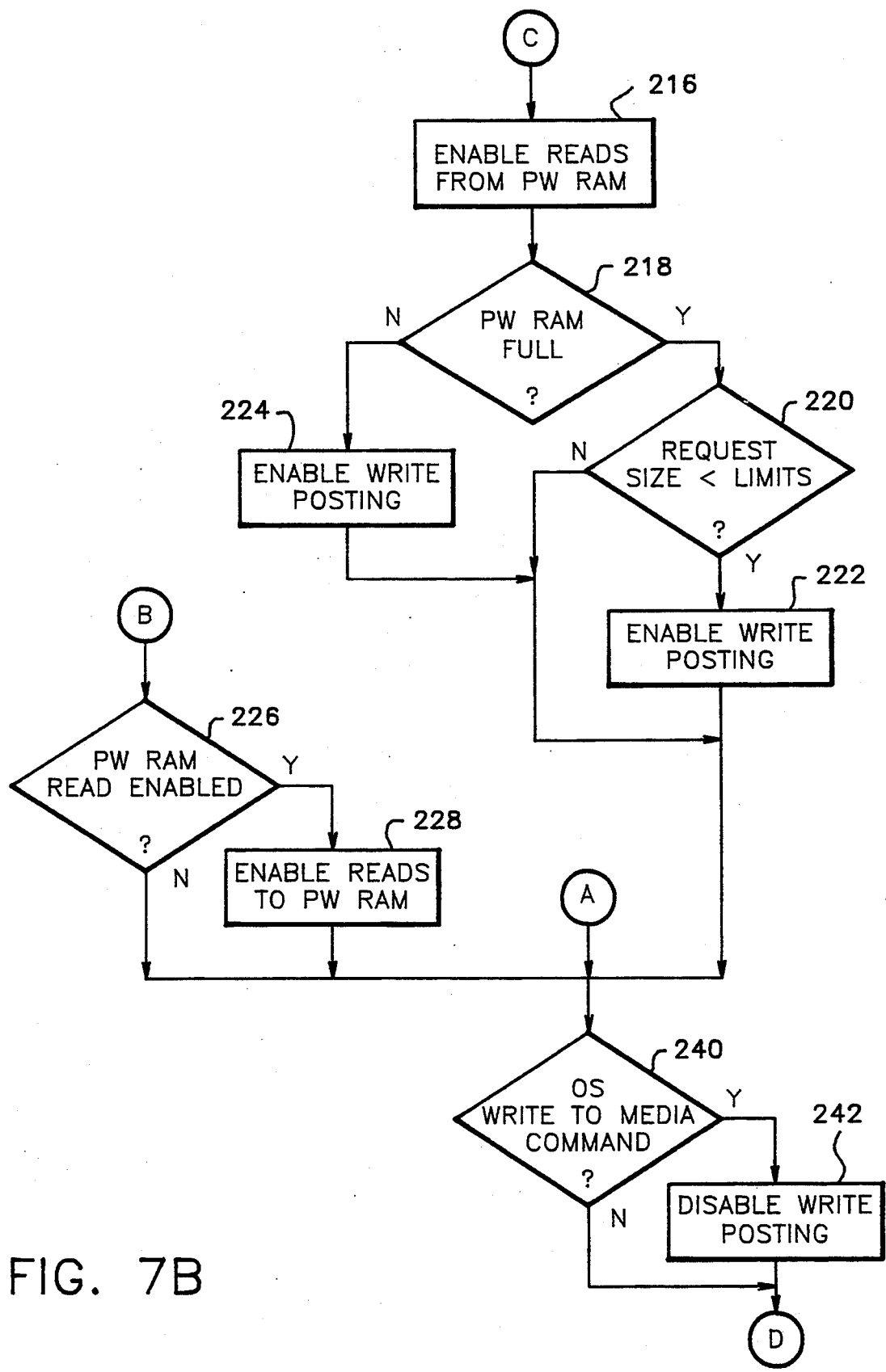
Figure 7C:
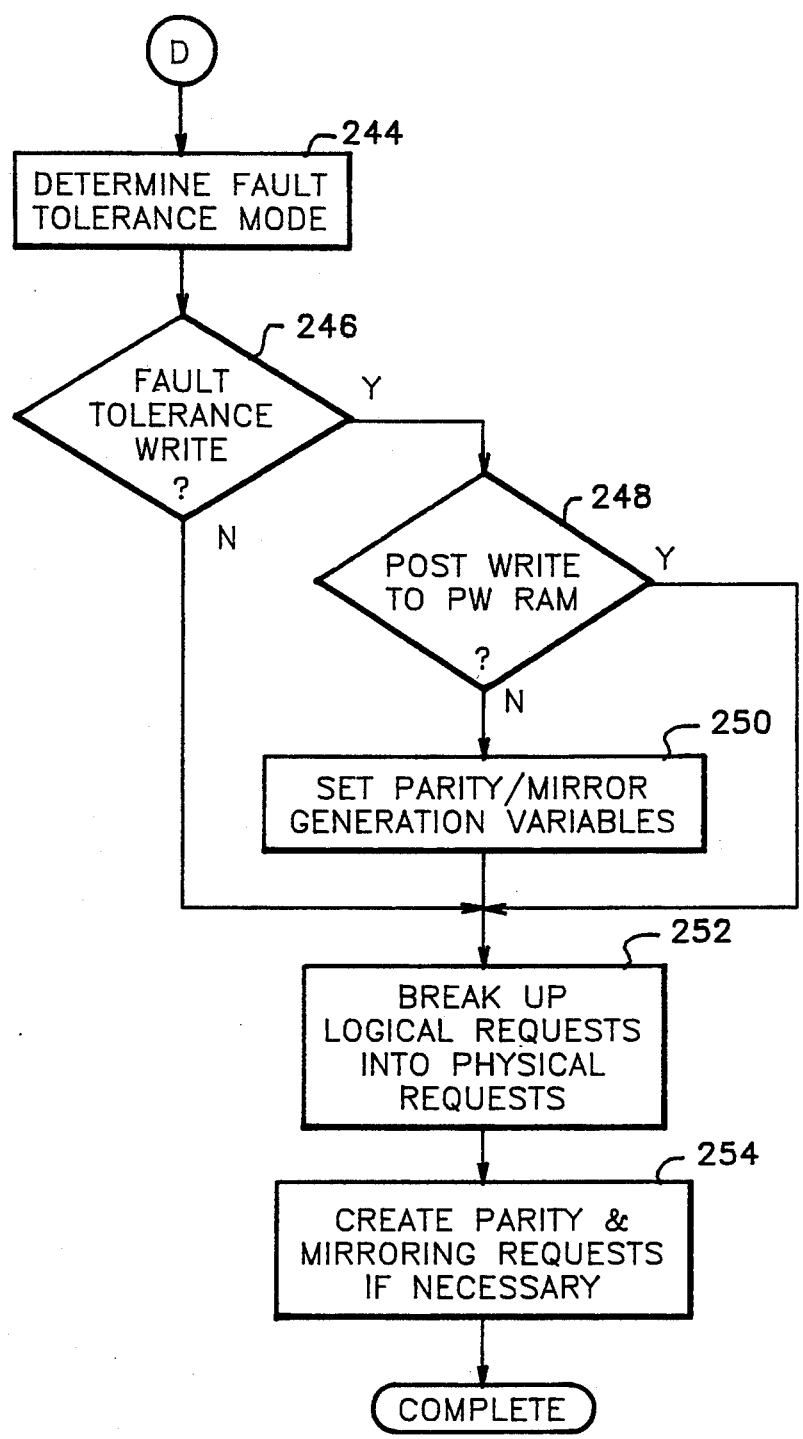

Referring now to FIGS. 7A–7C, a flowchart illustrating operation of the mapper task in the disk array controller D is shown. The mapper task performs the following steps for each logical request, generating a plurality of request lists that are provided to the scheduler task, discussed below. In step 202, the mapper task receives a logical request generated by the local processor 30 from a command list generated by the host requesting access to the disk array A. In step 204, the mapper task determines the respective disk and the sector where the request begins. In step 206, the mapper task determines the particular fault tolerance mode being used on the logical volume being accessed, either parity fault tolerance or mirroring, and whether the parity is distributed parity, etc. The mapper stores this information in the respective drive request.

In step 208, the mapper task determines the number of headers involved in the respective request and sets certain counting variables accordingly to guarantee that the entire logical request is performed. In step 210, the mapper task determines if the request is a host request for later use. If the request is not a host request, then the request was created by the flush task to flush data from the PW RAM 71 to the drive array A. A request created by the flush task is treated differently than a host generated request in the scheduler task, which is discussed below. In step 212, the mapper task determines if the PW RAM 71 has been configured for operation. If so, then the mapper task determines if posted writes are enabled for the respective logical volume being accessed in step 214. If posted writes are enabled for the respective logical volume in step 214, then in step 216 the mapper task enables read operations from the PW RAM 71 for this logical request.

In step 218, the mapper task determines if the PW RAM 71 is full. If the PW RAM 71 is not full in step 218, then the mapper task enables write posting in step 224 for the logical request and then progresses to step 240. Thus write posting is performed for all writes when the PW RAM 71 is not full. If the PW RAM 71 is full in step 218, then in step 220 the mapper task determines if the size of the request is less than certain limits. As previously discussed, if the PW RAM 71 is full, then the controller D delays posting requests having a size below a certain predefined limit and allows requests above a certain size limit direct access to the drive array A.

In the preferred embodiment, the respective limit is set at a full stripe write or greater. By allowing a full stripe write to be immediately sent to the drive array A, relatively little delays are introduced since the full stripe write does not require prior reads for parity generation. Smaller or partial stripe writes are delayed instead of being provided to the drive array A since these requests involve preceding read operations for parity and may hamper system performance. However, if the write is greater than a full stripe, then the write will essentially include a full stripe write and a partial stripe write, and performance of the partial stripe write will require preceding reads and hence may adversely affect system performance. Despite this, only writes that are less than a full stripe write are delayed. One reason for this is that the possibility of coalescing partial stripe writes into full stripe writes is greater on individual partial stripe writes as opposed to partial stripe writes resulting from a write operation greater than a full stripe write.

The mapper task makes a distinction between whether parity fault tolerance is being used in step 220. If parity fault tolerance is being used, then in step 220 the mapper task determines if the write is less than 24 kbytes and in step 222 the mapper task enables write posting for requests that are smaller than 24 kilobytes. As previously mentioned, the stripe size of the array A is 32 kbytes. Assuming a 3+1 mapping scheme, 3 drives or 24 kbytes of data storage are available, and thus 24 kbytes constitutes a full stripe. Since write posting is not enabled for writes 24 kbytes or larger, these operations will proceed directly to the drive array A.

If parity is not being used, then the mapper task determines in step 220 if the write is less than 4 kbytes and enables write posting for requests that are less than 4 kilobytes in step 222. Write requests greater than or equal to 4 kbytes are not posted but are provided directly to the drive array A. Since parity is not being used, no reads for parity are required, and thus these operations do not hamper system performance. However, the mapper task requires writes smaller than 4 kbytes to be posted to provide the flush task with the opportunity to coalesce these various small writes into a larger logical request, thus increasing system efficiency.

For the requests in which write posting is enabled, it is noted that these requests are not performed immediately since the PW RAM 71 is full. As described below, the scheduler task operates to delay the execution of requests if the PW RAM 71 is full. After enabling write posting in step 222, or if the requests are greater than their respective limits in step 220, the mapper task then proceeds to step 240. Also, if the PW RAM 71 was not configured in step 212, then the mapper task proceeds directly to step 240, and write posting is not enabled for these requests.

If write posting was not enabled for the respective volume in step 214, then in step 226 the mapper task determines if the PW RAM 71 is enabled for read operations. If so, then in step 228 the mapper task enables read operations for this logical request to the PW RAM 71. The mapper task then progresses from step 228 to step 240.

In step 240, the mapper task determines if an operating system command referred to as the "write to media" command has been asserted. In the preferred embodiment, a method is provided whereby the operating system can request that write posting not be enabled for certain write commands. The operating system uses this command for certain extremely sensitive data that it desires not to be written to the PW RAM 71, but rather the operating system desires that the data be written immediately to the drive array A to ensure that this data is immediately stored on the drive array A. If the "write to media" command is set in step 240, then in step 242 the mapper task disables write posting for the respective request. The mapper task then progresses from step 242 to step 244. If the "write to media" command is not set in step 240, then the mapper task progresses from step 240 to step 244.

In step 244, the mapper task determines the respective fault tolerance mode being used for the respective request. In step 246, the mapper task determines if the current request is a write which utilizes fault tolerance techniques such as either parity or mirroring techniques. If so, then the mapper task determines in step 248 if the write operation is to be posted to the PW RAM 71. If the current fault tolerant write operation is not to be posted to the PW RAM 71, then in step 250 the mapper task sets certain variables regarding parity or mirrored write generation for the write request. These variables are used by the mapper task later in step 252 to generate required data guard operations such as parity reads and writes if parity is being implemented, or mirrored writes if mirroring is being implemented. Data guard is a term used in this specification to generically refer to various disk data integrity or fault tolerance improvement techniques, primarily mirroring and parity. Here it is noted that a fault tolerant or data guard write that is not being posted in step 248 may be either a data guard host write that is not being posted or a data guard flush task write, which by definition will not be posted. If the write operation is a host fault tolerant write and it is determined that the write is to be posted in step 248, then the data guard information, i.e., the necessary parity reads and parity writes or mirroring writes are not generated now, but rather the extra data guard operations required are generated by the mapper task when the data is written back or flushed from the PW RAM 71 to the drive array A. Thus a host write that is to be posted is treated as a non-data guard write to the PW RAM 71 regardless of whether data guarding is being implemented. Therefore, if the write operation is not a fault tolerant host write in step 246, or if it is being posted to the PW RAM 71, then the respective operations required to implement parity or mirroring operation need not be generated here. If the respective request is determined not to be a fault tolerant write operation in step 246, i.e., if the write is a non-data guard write, the mapper task advances directly to step 252.

In step 252, the mapper task performs the task of breaking up the logical request into a number of physical requests or individual drive request lists. This operation involves generating a queue of individual drive request lists, i.e., generating a linked list of data structures representing requests to the individual drives. In step 254, the mapper task generates the required parity and mirroring operations for data guard write requests that are being provided directly to the drive array A, such as non-posted host writes and flush writes which require data guard requests.

FIG. 12

Figure 12:
FIG. 12 illustrates the various types of request lists that can be submitted to the task in FIGS. 8A–8F.
Figure 12:
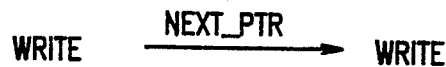
Figure 12:
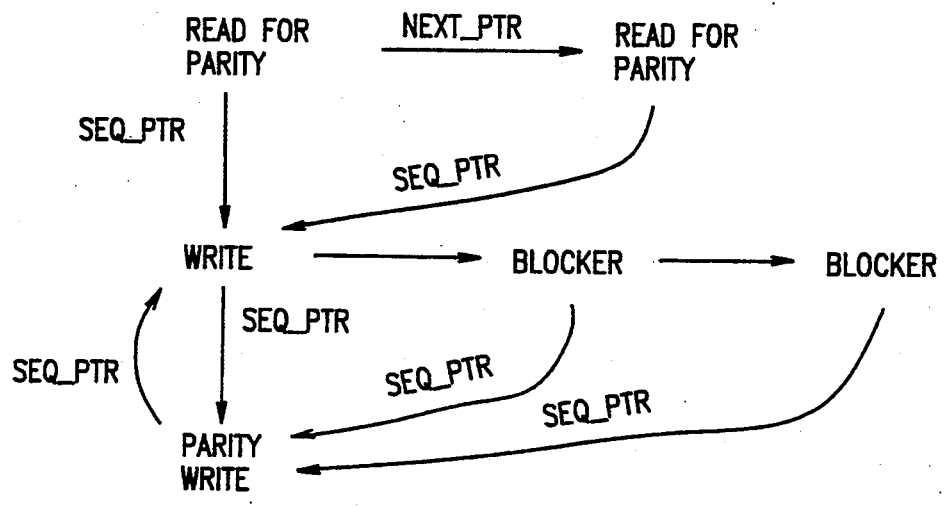
Figure 12:
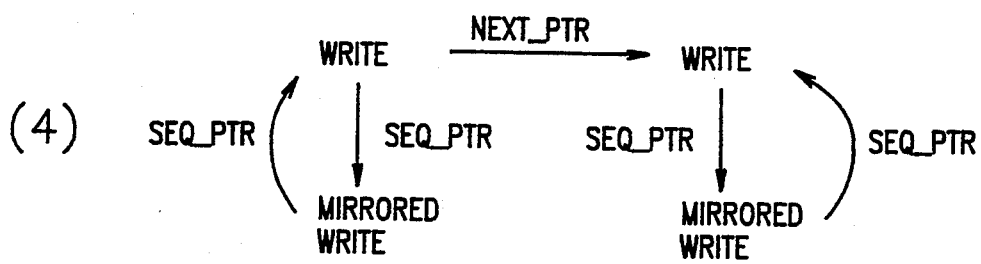

Referring now to FIG. 12, a request list generated by the mapper task may generally comprise either simple, i.e., non data guard, reads from the PW RAM 71 or disk array A, as shown in FIG. 12(1), simple, i.e., non data guard, writes, which comprise both non data guard writes to the drive array A and all writes posted to the PW RAM 71, as shown in FIG. 12(2), parity writes to the drive array A, as shown in FIG. 12(3), and mirrored writes to the drive array A, as shown in FIG. 12(4).

As shown, simple reads in FIG. 12(1) are linked by a pointer referred to as next_ptr. Likewise, simple writes in FIG. 12(2) are linked by next_ptr. Parity writes to the drive array A include reads for parity linked by the next_ptr, data writes and associated "blocker" writes linked by next_ptr, and one parity write. The reads for parity and the data writes are linked by a pointer referred to as seq_ptr. Likewise, the data write and blocker writes are linked to the parity write by seq_ptr. The blocker writes act as placeholders in the respective drive queues to ensure the integrity of the parity information with its corresponding data. A blocker write merely reserves a place in the drive queue, and no write operation actually takes place.

Mirrored writes include both normal writes and mirrored writes. The normal writes are linked by next_ptr, as shown. The mirrored writes are linked to their corresponding data writes by seq_ptr. Other types of parity writes and mirrored writes are generated, as well as simple reads and writes, and the writes in FIG. 12 are illustrative only.

The parity write illustrated in FIG. 12(3) is one example of a parity write to a single drive in a traditional 3+1 mapping scheme, which was described in FIG. 1. As such, the write requires two preceding reads for parity to the remaining two data drives to determine the data currently on these two drives. This data is used for parity generation. The actual data write includes a data write to one drive and two blocker writes to the remaining two unwritten data drives. Finally, the parity write is performed to the sole parity drive.

The structure of these different types of request lists is important in understanding the operation of the scheduler task because the task initially examines the first requests in a request list linked by next_ptr and indexes through seq_ptr to examine the remaining requests, if any. Therefore, indexing using seq_ptr is not required to examine all of the requests for simple reads and writes in FIG. 12(1) and (2) because all of the requests in the request list are linked only by next_ptr. Indexing through seq_ptr is used, however, to examine the data write requests in the parity write. If the request is a parity write, first the task examines the reads for parity connected by next_ptr. When the task learns the request list is a parity write, it indexes through the seq_ptr to the host writes and examines these requests. For reasons stated below, indexing through seq_ptr is not used to examine a parity write request in a parity write request list or mirrored write requests in a mirrored write request list. In addition, the scheduler task uses recursion to index through the various requests in a parity write or mirrored write when separating requests into their respective drive queues, as is explained below.

The scheduler task examines each of the requests in a request list and marks the requests accordingly before separating the commands into individual drive queues. This is necessary because, in some instances, the scheduler task is required to wait for lines in the PW RAM 71 to be flushed before it can initiate a request. Examples of such instances are a write to a dirty line in the PW RAM 71 which is being flushed, or a write to an area in the drive array A where dirty data corresponding to this area in the PW RAM 71 is being flushed. In these instances, the scheduler task must wait for the flush operation to complete before sending the requests to the individual drive queues. If the task examined two consecutive reads and sent these reads to their respective drive queues, the task would be unable to delay the writes in the request list if it needed to do so because the reads would have been already sent to their respective drive queues. Therefore, the scheduler task examines the data write requests in a parity write request list prior to separating requests into their respective drive queues.

It is noted that these same concerns do not arise in mirrored write request lists because the mirrored write requests are exact copies of the data write requests. If a data write request in a mirrored write request list was required to be delayed to allow a flush to complete, the flush would result in data written to the data portion of the drive array A as well as the mirrored portion. Thus, mirrored write requests in a mirrored write request list are not examined prior to separating the requests into individual drive queues. In addition, the parity write in a parity write request list is not examined because parity data is not stored in the PW RAM 71. Thus there is no need to examine the parity write requests since parity data cannot be involved in a flush operation.

SCHEDULER TASK

Referring now to FIGS. 8A–F, the scheduler task is shown. The scheduler task analyzes each request list generated by the mapper task, determines the types of requests involved with each respective request list, and marks the requests accordingly. The scheduler then divides the requests in the list into nine individual drive queues. The nine drive queues include 8 drive queues for the drive array A and a ninth drive queue for the PW RAM 71. Once the requests in a request list have been partitioned into individual drive queues, the dequeue task and the post processor task execute the requests in these respective drive queues to actually perform the data transfers and status updates to accomplish the reads and writes.

The scheduler task determines if the respective requests involve simple host read or write requests, i.e., requests that do not require or do not yet include data guard operations, or whether the request is a write request to be provided directly to the drive array and includes data guard operations, such as a parity write or a mirrored write. The scheduler task also marks the destination of each of the requests. Read hits to the PW RAM 71 and writes that are to be posted are marked as going to the PW RAM 71. PW RAM read misses and writes that are not to be posted are marked for the drive array A.

Figure 8A:
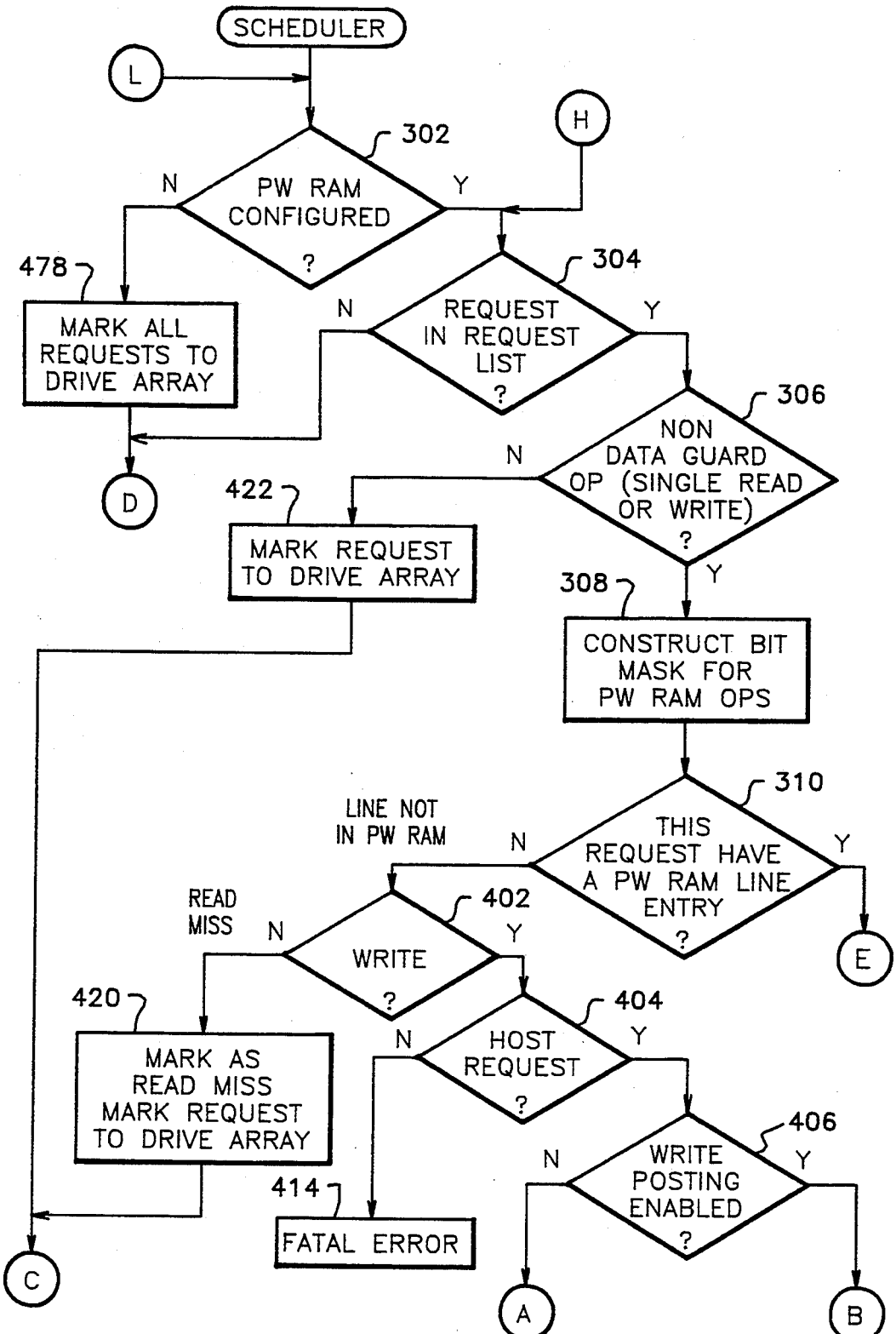
Figure 8B:
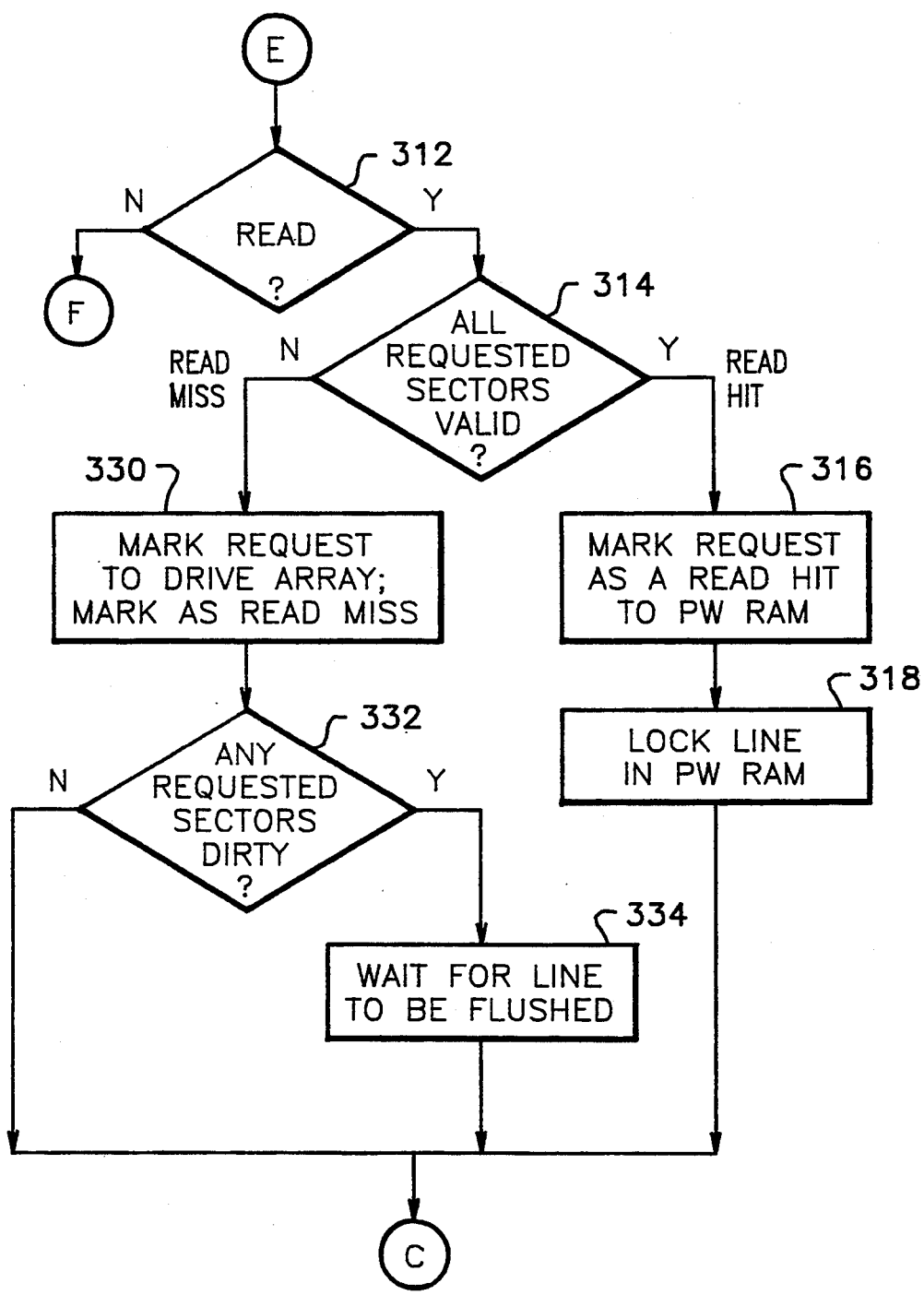
Figure 8C:
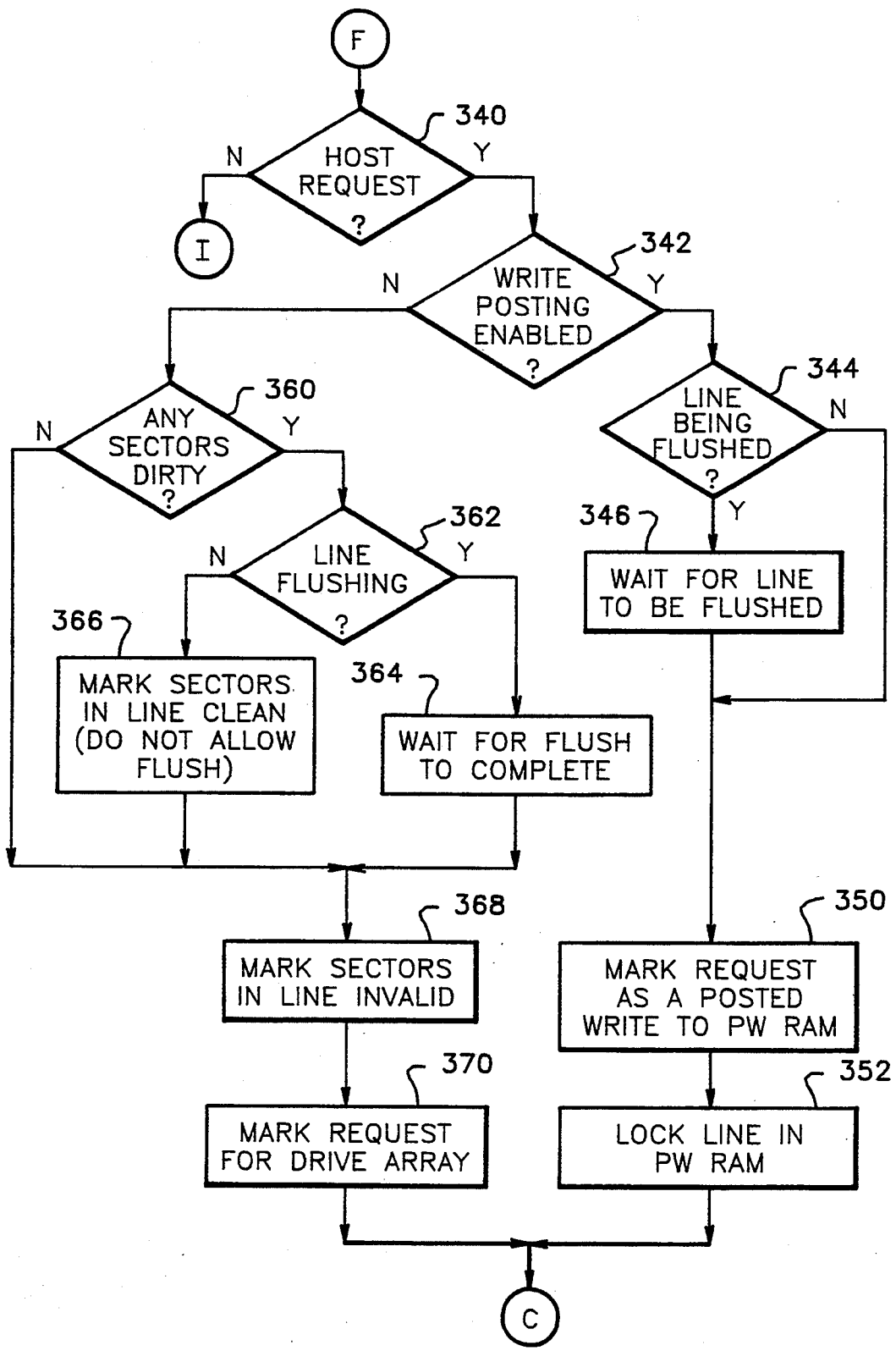
Figure 8D:
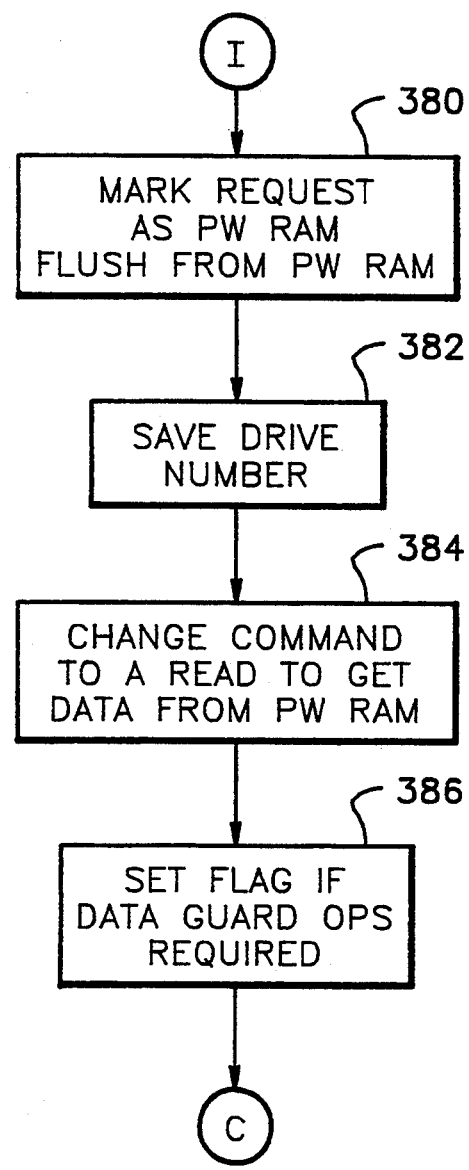

Referring now to FIG. 8A, the controller D executing the scheduler task examines individual requests in the request queue. In step 302, the scheduler task determines if the PW RAM 71 is configured for operation. If so, the scheduler task then determines in step 304 if any requests in the request list have not yet been examined. If one or more requests remain to be examined, then the scheduler task examines the next request in step 306 to determine if the request is a simple write or read request that is not related to fault tolerance. In this step, the scheduler task is only looking for simple data write or read requests, not parity writes. These requests include the simple reads and writes in FIG. 12(1) and (2), the reads for parity and data writes in FIG. 12(3), and the data writes in FIG. 12(4). Generally, the types of requests being excluded here are parity writes and mirrored writes.

If the request being examined involves a simple write or read, then in step 308 the scheduler task constructs a bit mask for the request. As previously discussed, the PW RAM 71 includes a plurality of lines storing data wherein each line corresponds to 16 sectors of a respective drive. The status information stored in the PW RAM 71 includes a plurality of 16 bit words storing a bit map representing data about each of the sectors comprising a line. As previously discussed, the bits in one 16 bit word represent whether each of the respective sectors are dirty, and the bits in another word represent whether each of the respective sectors are valid, etc. In step 308, the scheduler task constructs a bit mask for the sectors of the respective line in the PW RAM 71 which is being requested. In this manner, by using the bit mask when the status information in the PW RAM 71 is updated, only the status information bits pertaining to that portion of the line, i.e., the respective sectors being requested, need to be manipulated or changed. It is noted that the bit mask will only be used on posted writes and read hits to the PW RAM 71, but will not be used on reads or writes directly to the drive array A.

Once the bit mask has been constructed in step 308, then in step 310 the scheduler task determines if the request has a corresponding line entry in the PW RAM 71. If so, then in step 312 (FIG. 8B) the scheduler task determines if the current request is a read or write request. If the request is a read operation, then in step 314 the scheduler task determines if all of the requested sectors comprising the line entry in the PW RAM 71 are valid. If all of the sectors in the line entry are valid in step 314, then in step 316 the request is marked as a read hit and variables are set indicating that the destination of this request is the PW RAM 71. Since the request is a read hit, the request can be serviced from the PW RAM 71 without accessing the disk array A. In step 318, the respective line in the PW RAM 71 is locked to guarantee that the line is not accessed or replaced before the read operation from the PW RAM 71 completes.

Figure 8E:
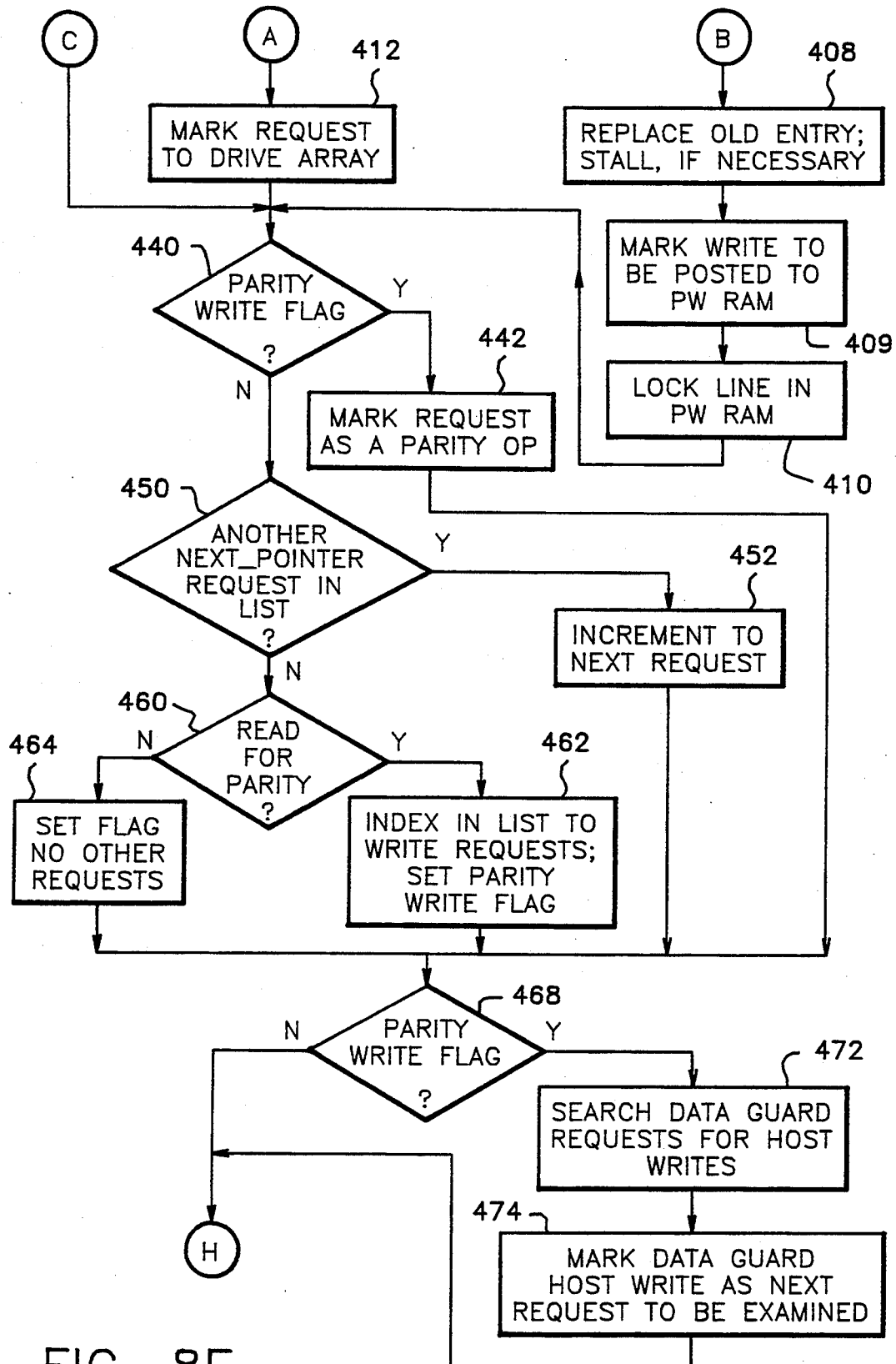

If all of the requested sectors in the PW RAM line entry are determined not to be valid in step 314, then the read request is marked as a read miss in step 330, and variables are set indicating that the destination of this request is the drive array A. In step 332 the scheduler task determines if any of the requested sectors in the cache line entry are dirty. If so, then in step 334, the scheduler task waits for the line to be flushed to the drive array A. The flush of the dirty sectors is allowed to complete to guarantee that the read request to the drive array obtains the current or correct data stored in the PW RAM 71 that otherwise had not yet been written to the drive array A. Otherwise, the read request may obtain stale or incorrect data from the drive array A. Here it can be assumed that the flush task is already running since dirty data resides in the PW RAM 71. As discussed below, the flush task runs continually, subject to being interrupted by a higher priority task, while dirty data resides in the PW RAM 71. If a flush is not running, then the scheduler task generates an error message (not shown) because this condition should never occur. Upon completion of the flush, the scheduler task advances to step 440 (FIG. 8E).

If in step 312 the request is determined to be a write operation, then in step 340 (FIG. 8C), the scheduler task determines if the write request is a request from the host. As previously discussed, a write request may either be generated by the host, i.e., a processor or external device, or by the flush task. The flush task continually scans the PW RAM 71, coalesces partial stripe write requests into full stripe writes, and generates logical write requests to the mapper, similar to a host. These flush logical requests are executed in a manner similar to a host generated logical request, with some important differences. The scheduler task determines if the request is a host request because of these differences, which are discussed below.

If the write request is determined to be a host write request in step 340, then in step 342 the scheduler task determines if posting is enabled. If posting is enabled in step 342, then in step 344 the scheduler task determines if the respective line in the PW RAM 71 is currently being flushed. If the line is not being flushed in step 344, then the scheduler task advances to step 350. If the line entry is being flushed in step 344, then in step 346, the scheduler task waits until the flush completes and all dirty sectors in the line have been written to the drive array A. The scheduler task then advances to step 350.

In determining if the line is being flushed in step 344, the scheduler task is concerned with data corruption problems. If the respective line is not being flushed, then the write request simply overwrites the current data (now stale data) when it is posted to the PW RAM 71, thus causing no problems. However, if the line is currently being flushed, then the scheduler task must wait for these sectors to be flushed to the drive array A. Otherwise, if the new write request was posted or written to the PW RAM 71, and the flush of that respective line completed thereafter, the status information of the line in the PW RAM 71 would be changed to reflect that the line entry contained clean data, when in fact the write request that was just performed resulted in dirty data being stored in the line entry, thus causing data corruption problems.

In step 350, the write request is marked as a posted write, and the destination for this write request is set to the PW RAM drive 71. In addition, the line entry in the PW RAM 71 is locked in step 352 so that this line cannot be replaced or flushed until the write operation completes. The scheduler task then advances to step 440 (FIG. 8E). It is noted that the request is marked to the PW RAM 71 in step 350 regardless of whether the PW RAM 71 is full. It was previously determined in step 310 that the request had a PW RAM line entry, and thus even if the PW RAM 71 is full, the new request can simply overwrite the old request in the respective PW RAM line.

If posting is not enabled in step 342, then a write to the disk array A must be performed as opposed to a write to the PW RAM 71. In step 360, the scheduler task determines if any of the respective sectors in the corresponding PW RAM line are dirty. If so, then in step 362 the task determines if the line is currently being flushed. If so, then in step 364 the scheduler task waits for the flush operation to complete. If the line is not currently being flushed, then the task marks all of the sectors in the line as clean in step 366 to prevent a subsequent flush of these sectors. Here it is important that data marked as dirty not remain in the PW Palm 71 after completion of a write to corresponding sectors in the drive array A. If this were to occur, then a subsequent flush of the PW RAM 71 would overwrite the correct data in the drive array with stale data. Therefore, if a flush is running to this line, the flush is allowed to complete. Otherwise, the dirty sectors are marked clean to prevent a subsequent flush from occurring.

Upon completion of either steps 364 or 366, or if no sectors were dirty in step 360, then in step 368 the scheduler task marks the respective sectors in the line invalid. This prevents a host from subsequently reading stale or incorrect data from the PW RAM 71. In step 370, the scheduler task marks the destination of the respective write request to the disk array A. The task then advances to step 440 (FIG. 8E).

If in step 340 the write request was determined not to be a host request, but rather was determined to be a flush write request, then in step 380 (FIG. 8D) the scheduler task marks the write request as a PW RAM flush request, indicating that the next operation for this request involves an access to the PW RAM 71 drive. In step 382, the scheduler task saves the respective drive number where this write is intended in the drive array A. In step 384, the scheduler task changes the command in the request to a read operation in order for the local processor 30 to retrieve the data from the PW RAM 71. The scheduler task also sets a flag in step 386 if a data guard operations, either parity writes or mirrored writes, are required. The read operation generated in step 384 then proceeds normally. The original write request, which enables the local processor 30 to write the data retrieved from the PW RAM 71 to the drive array A is restored later in the post processor task, discussed below. For this reason it is necessary to save the drive number destination for the original write request in step 382. Upon completion of step 386, the task advances to step 440 (FIG. 8E).

If in step 310 (FIG. 8A) the scheduler task determines that the respective line involved in the request does not reside in the PW RAM 71, then in step 402 the scheduler task determines if the request is a write request. If the request is determined to be a write request, then in step 404 the scheduler task determines if the request is a host request. If so, then in step 406 the scheduler task determines if write posting is enabled. If posting is enabled in step 406, then in step 408 (FIG. 8E) the scheduler task marks a line entry in the PW RAM 71 for replacement using a true LRU algorithm. Here it is noted that if the PW RAM 71 is full, the task delays until a line entry is available. In step 409, the task marks the request as a posted write and sets the destination of this request to the PW RAM 71. In step 410, the respective line in the PW RAM 71 to which this write request is destined is locked to guarantee that the line is not replaced again before the posting operation is performed. The task then advances to step 440. If write posting is not enabled in step 406 (FIG. 8A), then in step 412 (FIG. 8E) the scheduler task marks the destination of the write request as the disk array A. Upon completion of step 412, the task advances to step 440.

If in step 404 the write request is determined not to be a host request, but rather is determined to be a flush request, then an error signal is generated in step 414. This is deemed to be an error because a flush request, i.e., a request generated by the flush task, inherently involves a line entry which resides in the PW RAM 71. In arriving at this step, it was previously determined in step 310 that this request did not have a line entry in the PW RAM 71. Therefore, it should be impossible for this request to be determined a flush request in step 404. Therefore, this situation should never occur unless an error has occurred.

If in step 402 (FIG. 8A) the request is determined to be a read request, then this read request inherently involves a read miss as the line being read does not reside in the PW RAM 71. The scheduler task advances to step 420, marks the request as a read miss, and sets the destination of the request to the disk array A. The scheduler task then advances to step 440 (FIG. 8E).

If in step 306 the request is determined to be a write or read request involving fault tolerance, i.e., a read request for parity, a parity write, or a mirrored write, then in step 422 the scheduler task sets the destination of the request as the drive array A. The scheduler task then advances to step 440 (FIG. 8E).

Upon completion of any of steps 410, 412, 420, 422, 318, 332, 334, 352, 370, or 386, in step 440 the scheduler task determines if a flag referred to as the parity write flag is set. The parity write flag is set to indicate that the current request being examined is a write operation which includes parity generation, i.e., a parity write request list. This flag is set below in step 462 when the task learns that the request list comprises a parity write. The following sequence of steps from step 440 to step 474 allows the scheduler task to peek ahead at the data write requests in a parity write request list before any of the read for parity requests are initiated to the drive array A. As previously noted, the scheduler task must be able to wait for any flush operation to complete for data coherency reasons. These same concerns do not arise with regard to mirrored writes because mirrored writes do not include preceding reads. Also, all of the non-mirrored data writes in a mirrored write request list can be examined by indexing through the next_ptr and the mirrored writes will be identical to the data writes. Therefore, the parity write flag is not set for mirrored writes. In addition, the parity write flag is not set for parity writes since parity data is not stored in the PW RAM 71.

If the parity write flag is set in step 440, then the request, which will be a subsequent write in a parity write request list, is marked as a parity operation in step 442, and the task advances to step 468. The write is marked as a parity operation so the write is not examined again later in step 488, discussed below, when recursion is used to send the requests to their respective drive queues.

If the parity write flag is not set in step 440, then in step 450 the task determines if more unexamined requests connected by the next_ptr remain in the request list. If so, then in step 452 the task increments to the next request and then advances to step 468. If the parity write flag is not set in step 468, which will be the case for the reads for parity in a parity write request list, and which will also be the case for simple reads and simple writes, then the task returns to step 304 to examine subsequent requests.

If the current request is the last request linked by the next_ptr, i.e., is the last simple read or write request in the request list, or the last read for parity or write in a parity nonposted write, then in step 460 the task determines if the request is a read for parity.

If the request is a read for parity in step 460, then in step 462 the task indexes in the request list to the first write. At this point, the request list will include data writes and blocker writes connected by next_ptr, and a parity write connected to the above requests by seq_ptr, as previously discussed. The task sets the parity write flag for this request list and then advances to step 468. If the request is not a read for parity in step 460, then it sets a flag indicating that this is the last request in the request list. This will be the last request in the list since it was determined that there were no other requests connected by next__ptr in step 450. The task then advances to step 468.

As previously noted, in step 468 the task determines if the parity write flag is set. If so, then in step 472 the task searches through the requests for host writes, ignoring the blocker requests. In step 474, the task marks the first host write that it finds as the next request to be examined. The task then returns to step 304 to again traverse through the above steps and examine the host write. This process repeats for all of the host data writes. If no more host data writes remain in the request list, then no request is marked in step 474, and the task exits to step 482 from step 304. It is noted that for subsequent host writes, the parity write flag will be set, and thus subsequent host writes are simply marked as parity as in step 472. The parity write request is not examined.

In summary, with regard to nonposted parity writes, the read for parity requests will traverse through the above steps with step 452 operating to increment through these until the last read for parity. When the last read for parity occurs, step 462 operates to index into the host write and blocker requests, with steps 472 and 474 operating to filter out the blocker requests. In this manner, the scheduler task looks at all of the host write requests in a request list prior to separating the requests into individual drive queues, which is discussed below. This enables the scheduler task to stall write requests, if necessary, before the preceding reads are sent to the drive queues, thus allowing PW RAM lines that require flushing to be flushed.

Figure 8F:
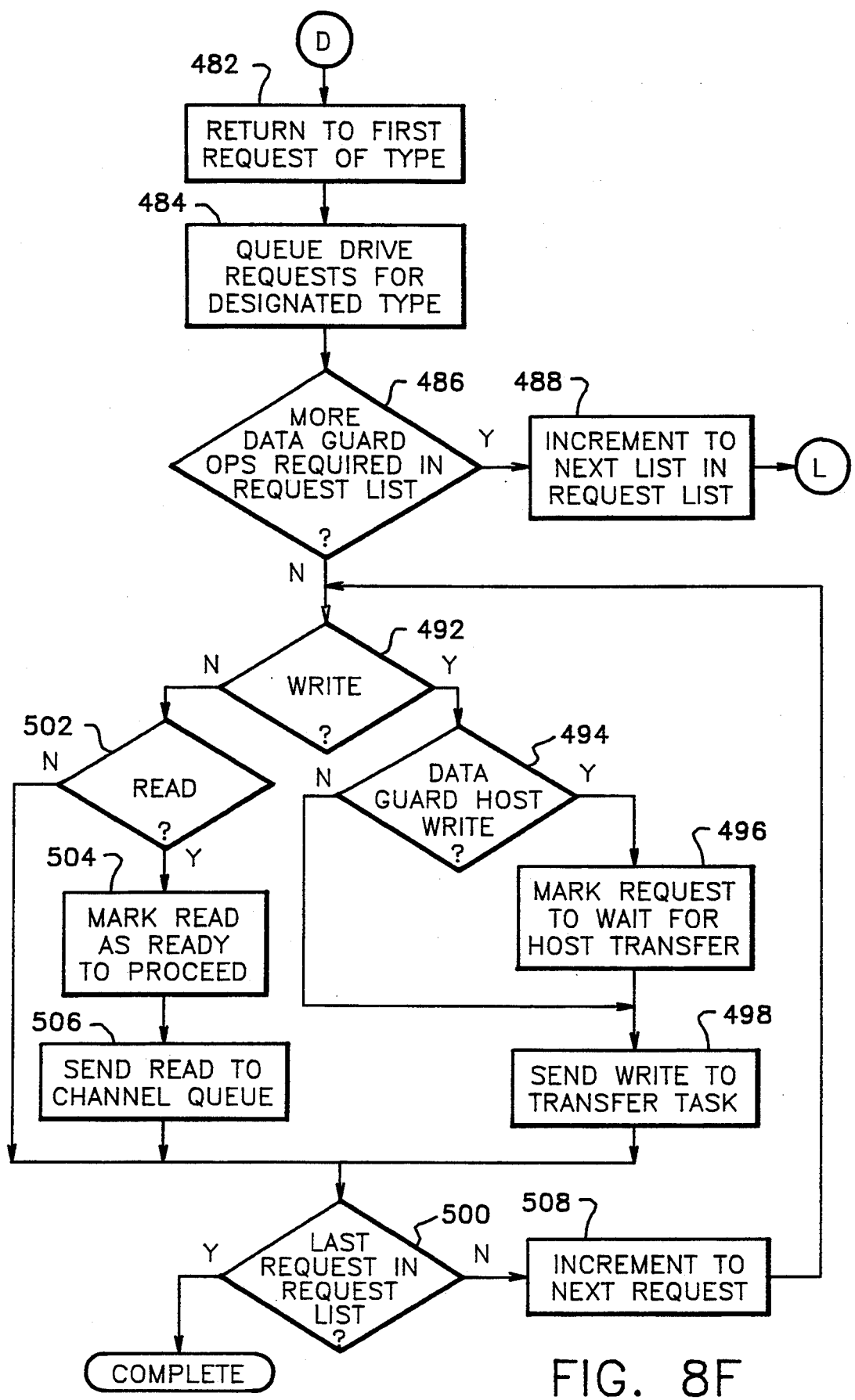

If the PW RAM 71 was not configured in step 302 (FIG. 8A), then the task marks the destination of all of the requests to the drive array A in step 478 and advances to step 482 (FIG. 8F). When the scheduler task has finished examining and marking all requests in the request list in step 304, then the task advances to step 482. In step 482 the task returns to the first request in the request list. In step 484, the scheduler task separates the first number of requests linked by next__ptr into individual drive queues. For requests lists of the first two types, simple reads or simple writes, this will constitute all of the requests. For a nonposted parity write, this involves only the reads for parity. If more requests remain in the request list in step 486, i.e., if the request list is a nonposted parity write, then the task increments through the sequence__ptr to the next group of requests connected by next__ptr in step 488. The next time step 482 is executed, the next group of requests will be either the host writes in a parity write request list or the mirrored writes in a mirrored write request list, and returns to step 302 to again traverse through the above steps. It is noted that during subsequent passes through the scheduler task, the task determines in step 306 that the requests are not simple reads or writes, and thus a majority of the examining and marking steps are skipped. The recursion is aimed at executing step 484 once more on nonposted mirrored writes and twice more on nonposted parity writes to send the host data writes and the parity or mirrored writes to their respective individual drive queues. If the request lists contain only simple reads or simple writes, then no recursion takes place, and the task advances to step 492. Also, when the task has partitioned all of the requests into individual drive queues, the task advances to step 492.

If the request involves a write in step 492, then the task advances to step 494 and determines if the write is a data guard host write. If so, then the task marks the request with a flag indicating that the disk request cannot take place until the write data has been obtained from the host. Upon marking the request in step 496, or if the write was not a data guard host write in step 494, then in step 498 the scheduler task sends the write to a task referred to as the transfer task. The transfer task initiates the operation of transferring the host write data to the disk array controller D. The scheduler task then determines if the current request is the last request in the list in step 500. If not, then the task increments to the next request in step 508 and returns to step 492. If so, then the scheduler task completes and begins operation on a new request list.

If the request is not a write in step 492, then the task determines if the request is a read request in step 502. If not, then the request is a blocker request, and the task advances to step 500. If the task is a read in step 502, then in step 504 the task marks the read as ready to proceed when it reaches the head of the queue. In step 506, the read request is then sent to a respective channel queue to be executed to the respective drive if it is at the head of the queue. The task then advances to step 500.

FLUSH TASK

Referring now to FIGS. 9A–9D, a flowchart diagram illustrating operation of a task which scans the lines in the PW RAM 71, coalesces partial stripe write operations into logical requests comprising full stripe writes, if possible, and sends these flush logical requests to the mapper task to flush dirty lines, is shown. The flush task uses several pointers to accomplish its operations. One pointer referred to as F__PTR points to the current PW RAM line being examined. Another flag referred to as CLEAN__PTR is set to a line when the flush task finds that the line is clean. The CLEAN__PTR is cleared whenever a line is dirtied in the PW RAM 71 while the flush task is operating, regardless of which line is dirtied. Therefore, if the flush task traverses through the entire PW RAM 71 and back to the position of the CLEAN__PTR with the CLEAN__PTR still being set, i.e., no other lines were dirtied during this time, then the flush task knows that the entire PW RAM 71 contains only clean data. At this time it halts operation, negates the BAT__ON signal to turn off the battery backup, and allows other tasks to operate.

In step 602, the flush task determines if a task referred to as the surface analysis task is executing. The surface analysis task operates when no other task is operating and verifies data integrity and the correctness of parity information in the drive array A. This task also corrects bad parity information. More information on this general operation can be obtained from Ser. No. 556,646, entitled "Intelligent Disk Array Controller Background Surface Analysis" filed on Jul. 20, 1990 and hereby incorporated by reference. If the surface analysis task is running in step 602, then the flush task waits in step 604 for the surface analysis task to complete.

When the surface analysis task completes in step 604, or if surface analysis was not running in step 602, then the flush task begins the operation of scanning the PW RAM 71 to flush dirty lines to the drive array A. The flush task continually operates until it completely flushes the PW RAM 71 or is interrupted by a higher priority task. In step 606, the flush task determines if the PW RAM 71 is enabled and if posting is enabled. If not, the flush task continues performing step 602 until posting is enabled by another task. If so, then in step 608, the flush task determines if the respective line that it is examining is marked as currently being flushed.

Figure 9A:
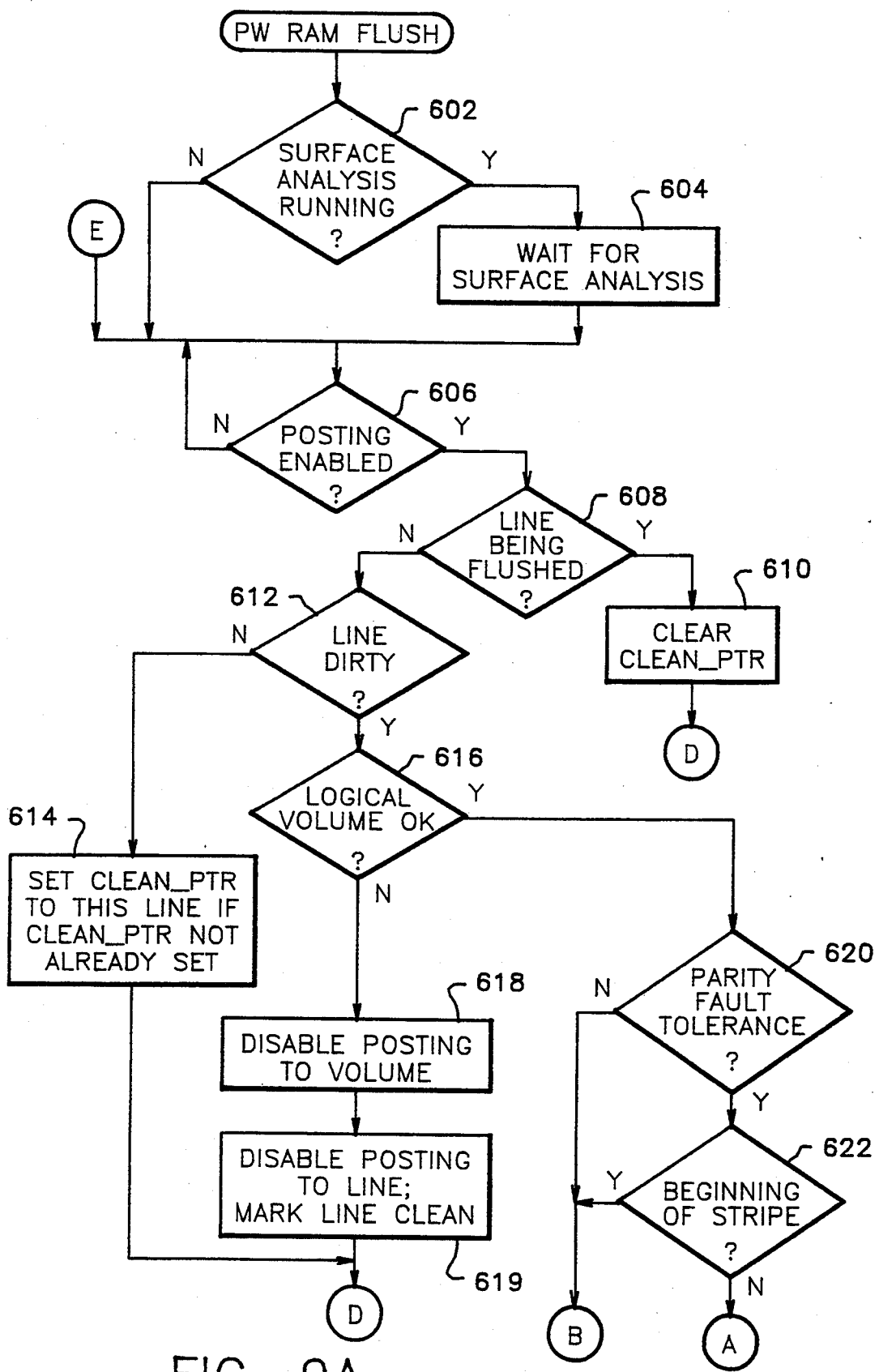
Figure 9B:
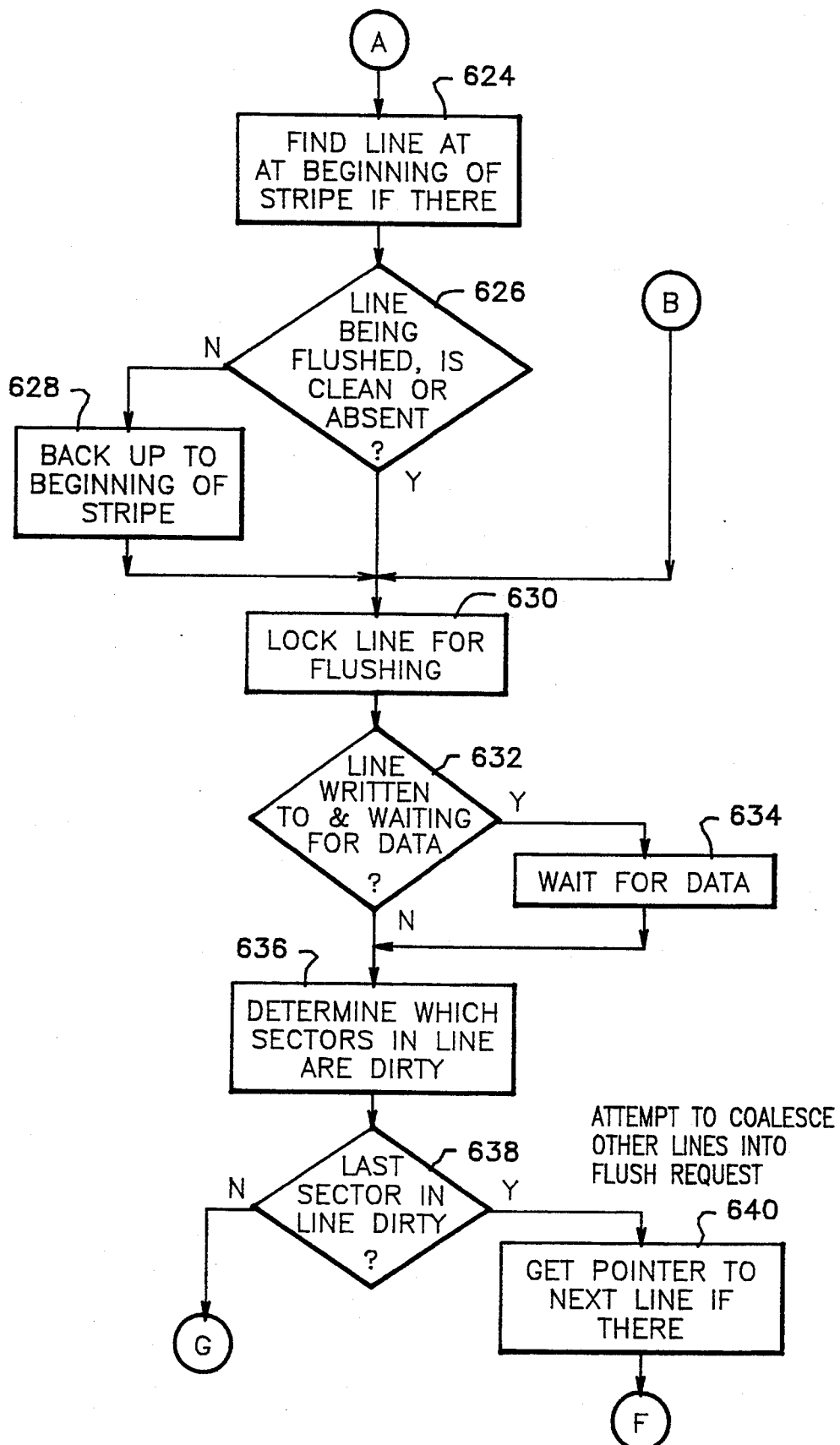
Figure 9C:
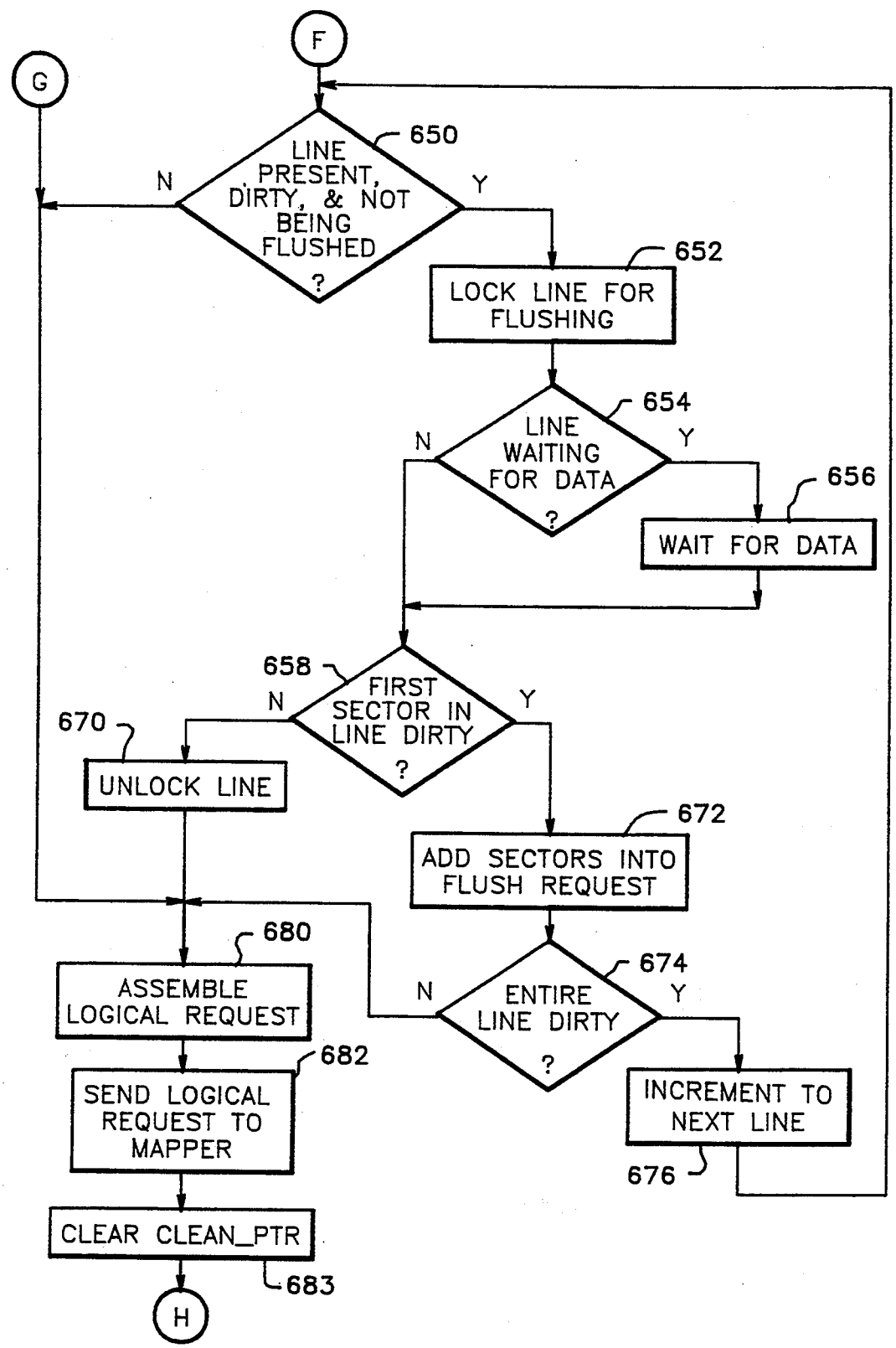
Figure 9D:
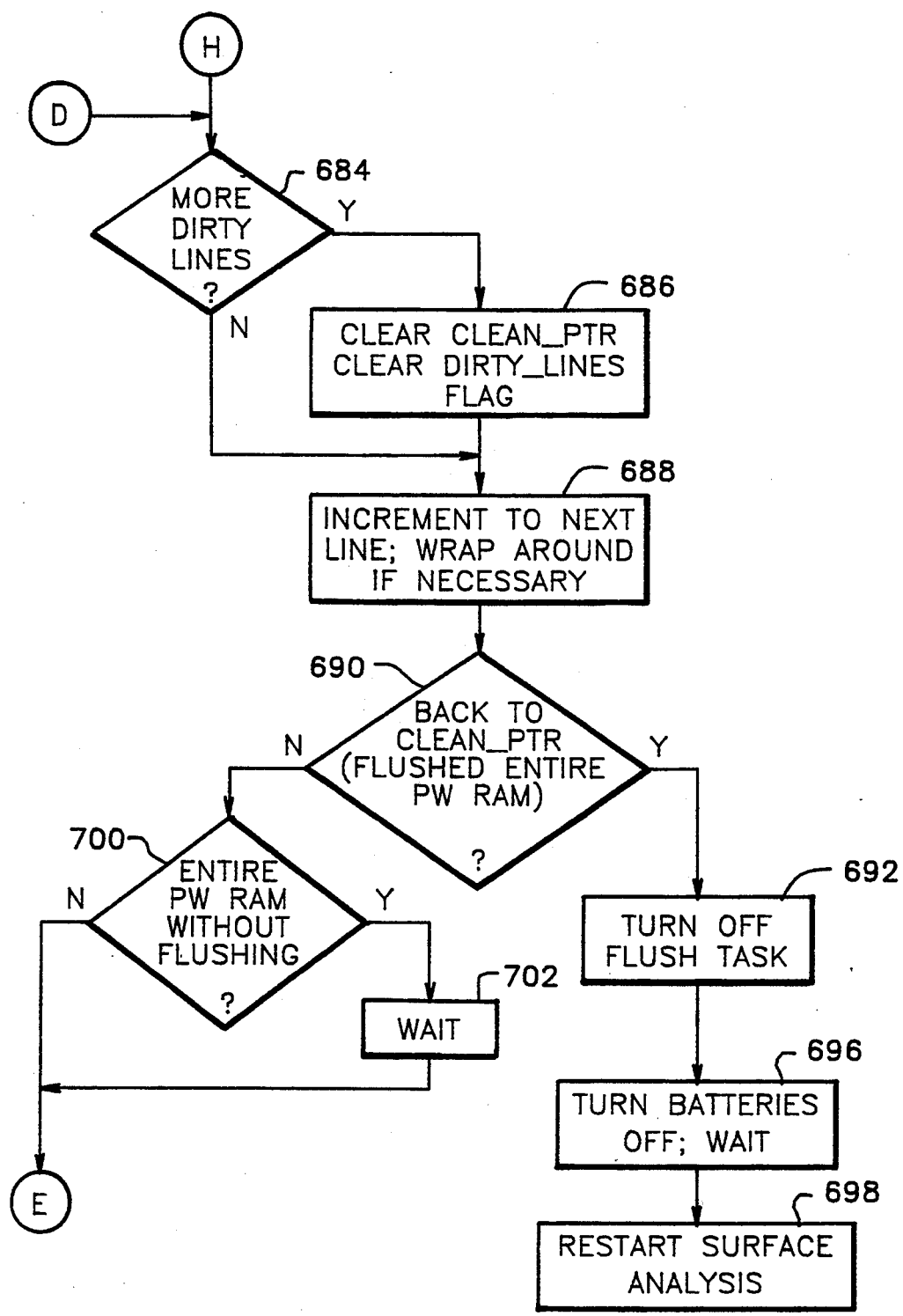

If the line being examined is currently being flushed in step 608, then the flush task clears the CLEAN_PTR in step 610. CLEAN_PTR is cleared because this line has dirty data that has not yet been flushed. Also, the line may have more dirty bits that were not marked as flushed. If the line is not marked as being flushed in step 608, then in step 612 the flush task determines if the line is dirty, i.e., if the line contains dirty data. If the line is clean in step 612, then in step 614 the CLEAN_PTR is set equal to this line if CLEAN_PTR is not currently set to any line. If CLEAN_PTR is set for a prior line, then CLEAN_PTR is not updated to point to this new line. Thus, here the CLEAN_PTR serves as a marker to a clean line, and if the flush task traverses the entire PW RAM 71, and returns to this line and the CLEAN_PTR is still set at this line, then the flush task knows that the entire PW RAM 71 contains only clean data. Upon completion of setting the CLEAN_PTR in step 614, the flush task advances to step 584 (FIG. 9D).

If the line contains dirty data in step 612, then in step 616 the flush task determines if the respective logical volume where the dirty line would reside is functioning properly. If the logical volume is not functioning properly in step 616, then in step 618 flags are set indicating that write operations should no longer be posted to this logical volume, and posting is also disabled to this line in step 619. Also, the line is marked clean in step 619 to prevent further examination of this line and a permanent dirty flag is set to indicate that the line is dirty. This prevents other data from overwriting this data in the PW RAM 71. The permanent dirty flag is cleared upon a system reset, at which time another attempt may be made to flush the dirty data back to the PW RAM 71. The task then advances to step 684 (FIG. 9D).

If the logical volume is operating properly in step 616, then in step 620 the flush task determines if the respective logical volume is utilizing a parity scheme, either a distributed parity scheme such as RAID level 5 or a simple parity scheme such as RAID level 4. The flush task determines if the logical volume is implementing parity because, if so, it is desirable that the flush task generate a flush logical request at the beginning of a stripe in order to perform a full stripe write. This obviates the necessity of having to do preceding read operations to discover the data or parity information on the unwritten sectors on the disk prior to the write, which would be required in a partial stripe write operation. If the logical volume is not using a parity scheme, then the flush task advances to step 630.

If the logical volume is using parity in step 620, then in step 622 the flush task determines if the current line being examined is at the beginning of its respective stripe. If the line is at the beginning of its respective stripe, then the flush task advances to step 630 (FIG. 9B). If the line being examined is not at the beginning of its respective stripe in step 622, then in step 624 (FIG. 9B) the flush task attempts to find the respective line at the beginning of the stripe. In step 626 the flush task determines if the line at the beginning of the stripe is currently being flushed, is clean, or is absent. This determination is similar to the determination previously made in steps 608 and 612, and is made for a similar reason, which is to determine if the line has dirty data that can be flushed. If the line is currently being flushed, is clean, or is absent, then the flush task advances to step 630 and resumes examining the original line which was found to be in the middle of the stripe. This is because the line at the beginning of the stripe cannot be included in a logical request to be flushed if it is currently being flushed., or is clean, or if the respective line is not present. If the first line in the stripe is present in the PW RAM 71 and is determined to be dirty and not being flushed in step 626, then in step 628 the flush task backs up to this line to begin coalescing lines at the beginning of the respective stripe. Here the flush task changes from the line it was previously examining to the line at the beginning of the stripe, and this line is now examined.

In step 630, the flush task locks the respective line. Here, the flush task sets a bit in a status word associated with the line indicating that the line has been locked for flush purposes, i.e., the line will soon be flushed. Locking the line prevents the host from accessing this line and also prevents new data from being written to this line. In step 632, the flush task determines if the respective line that has been locked to be flushed has been written to, i.e., if it is waiting for data that has been posted to the PW RAM 71. If so, then in step 634 the flush task waits for this data to arrive at the line. In this situation, data corruption problems may result if a line that has been written to and that is waiting for data is included in a flush logical request. If this were to occur, new data may enter into the respective line of the PW RAM 71 that would be marked dirty, and if the flush subsequently completed at a later time, this otherwise dirty data would erroneously be marked clean, thus locking this data in the PW RAM 71 and causing possible erroneous operation.

After the flush task has waited in step 634, or if the line was not waiting for data in step 632, then in step 636 the flush task checks the line to determine which sectors in the line are dirty. In step 638 the flush task determines if the last sector in the respective line is dirty. If the last sector in the line being examined is dirty, then the flush task may be able to coalesce dirty sectors from the subsequent line, or a plurality of subsequent dirty lines, to possibly form a full stripe write or greater. If the last sector in the line being examined is dirty in step 638, then the flush task attempts to retrieve a pointer to the next line in step 640, provided that the next line resides in the PW RAM 71. The flush task examines the next line in the same stripe, or if the line currently being examined is at the end of a stripe, it examines the first line in a subsequent stripe, to determine if the subsequent line contains dirty sectors. After attempting to retrieve the pointer to the next line in step 640, the flush task determines if the next line is present and is both dirty and not currently being flushed in step 650 (FIG. 9C). This determination is similar to the determination previously made in step 626 (FIG. 9B) and the determinations made in steps 608 and 612. If the line is present and is either clean or currently being flushed in step 650, then the flush task disables checking for further dirty lines and advances to step 680.

If the line is present and is both dirty and not currently being flushed in step 650, then in step 652 the task locks this line, setting the appropriate status bits. In step 654, the task determines if the line is waiting for data, i.e., if the line has recently been written to. This step is similar to step 632 (FIG. 9B), previously described. If the line is waiting for data, then the task waits in step 656 for this data to arrive. After waiting in step 656, or if the line had not been written to and was not waiting for data in step 654, then in step 658 the task determines if the first sector in the respective line is dirty. If the first sector in the line is not dirty in step 658, then in step 670 the task disables locking of this line for flush purposes, discontinues checking for further dirty lines to coalesce into this logical request, and advances to step 680.

If the first sector in the line is dirty in step 658, then in step 672 the flush task adds the number of dirty sectors into the logical request that is to be created. In step 674 the task determines if the entire line being examined is dirty. If not, the task discontinues searching for further dirty lines to coalesce into this logical request and advances to step 680. If the entire line is dirty in step 674, then the task increments to the next line in step 676 and then returns to step 650 to continue looking for further lines to be included or coalesced into this logical request. This process continues until the portion of the task from step 650 to step 676 determines that a line is not present, or finds a line with one or more clean sectors, i.e., the first sector clean in step 658, or any other sectors clean in step 674, or if the task finds a line that is being flushed or is entirely clean in step 650. At this point, the task discontinues looking for further dirty lines to coalesce because no more lines can be contiguously included into the logical request.

Having found one or more contiguous lines which can be coalesced together, the flush task now assembles a logical request for these lines in step 680 so that all of these lines may be flushed back to the drive array A as one logical request. The flush task assembles a logical request from all of the lines found to be contiguous and dirty in steps 612-676. In step 682 the flush task sends this logical request to the mapper task previously described. As previously discussed, the mapper task examines the logical request created by the flush task, marks the request, and splits up the logical request into a queue of request lists. The mapper task in turn calls the scheduler task, which as previously discussed marks the requests in each request list as to its type and destination, and splits up the request into individual drive queues. These requests are then executed by the dequeue task and the post processor task, discussed below, along with host generated requests, to actually transfer the data between the host, PW RAM 71, and drive array A, as required.

In step 683, the flush task clears CLEAN_PTR. This provides the mapper, scheduler and post processor tasks with sufficient time to actually flush the dirty data to the drive array A. This prevents the PW RAM 71 from potentially being marked completely clean while dirty data still resides in the PW RAM 71 waiting to be flushed. Also, as previously discussed, CLEAN_PTR is cleared in step 610 if the flush task examines a line that has been marked as being flushed but the flush has not yet been completed.

In step 684 (FIG. 9D), the flush task determines if any new lines have been dirtied since the last time this check was made. If so, then in step 686, the task clears the CLEAN_PTR. The flush task also clears a flag referred to as DIRTY_LINES in step 686. The DIRTY_LINES flag is set when any line is the PW RAM 71 is subsequently dirtied. By clearing this flag, the flush task can subsequently detect when new lines are dirtied the next time step 684 is executed.

After clearing the CLEAN_PTR in step 686, or if more lines were not dirtied in step 684, then in step 688 the task increments to the next line. Here it is noted that the next line may be the next portion of a stripe on a subsequent drive in the drive array A or it may be a portion of a new stripe. In step 690 the task determines if it has traversed through the entire PW RAM 71 without any further lines being dirtied and has returned back to where CLEAN_PTR was set. If so, this indicates that the entire PW RAM 71 has been flushed and therefore contains no more dirty lines. If this occurs, then in step 692 the task sets a flag to indicate that the flush task is no longer running. In step 696 the flush task turns off the backup batteries to the PW RAM 71 by negating the BAT_ON signal. Since the PW RAM 71 contains no more dirty lines, batteries are no longer required for data protection. The flush task then terminates operations and enables surface analysis operations to resume in step 698.

If the task has not returned to where CLEAN_PTR was set in step 690, i.e., has not traversed through the entire PW RAM 71 and returned to the CLEAN_PTR line without any further lines being dirtied, then in step 700 the task determines if it has traversed through the entire PW RAM 71 without flushing anything. This situation is intended for instances where the task has searched through the entire PW RAM 71 without flushing anything but yet some lines in the PW RAM 71 are locked for flush purposes, indicating that a flush is to be performed for these lines. This occurs when for some reason it is taking an unusually long time to flush dirty lines. If the condition in step 700 is true, then the task waits in step 702 and allows other lower priority tasks to run. Upon completion of the wait period in step 702, or if the task has not been through the entire PW RAM 71 without flushing in step 700, then the task returns to step 606 to examine the next line in the PW RAM 71. This process repeats until the flush task is interrupted or flushes the entire PW RAM 71.

DEQUEUE TASK

Figure 10:
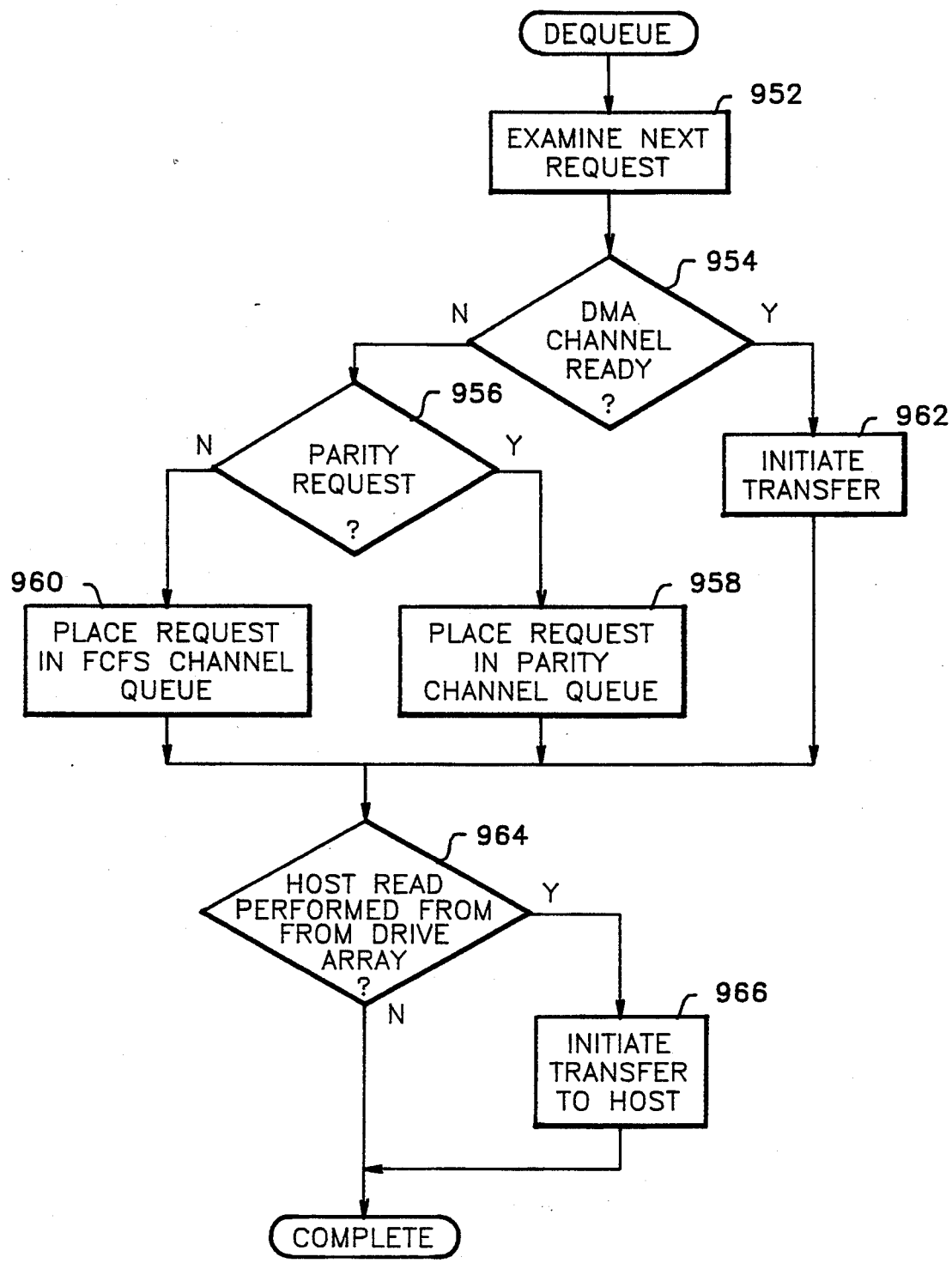

Referring now to FIG. 10, once the scheduler task has initiated transfer of the request at each of the individual drive queues, later requests in each of the queues are initiated by a task referred to as the dequeue task. In step 952, the dequeue task examines a request at the head of the respective drive queue being examined. In step 954, the task determines if a DMA channel in the transfer controller 44 is ready for the request. If not, then in step 956 the dequeue task determines if the request is a parity request. If so, then the task places the request in a channel queue referred to as the parity channel queue in step 958. If the request is not a parity request, then the task places the request in a queue referred to as the first-come-first-serve (fcfs) channel queue in step 960. The task then advances to step 964.

If a DMA channel is ready in step 954, then the dequeue initiates the transfer in step 962. Upon completion of the transfer, the post processor task is invoked to perform various post processing, as described further below. After initiating the transfer in step 962, or upon completion of either of steps 958 or 960, the dequeue task determines if the transfer was a host read performed from the drive array A. If so, then the task initiates a transfer to the host in step 968. Upon completion of step 966, or if the request was not a host read, the dequeue task completes. The dequeue task is invoked again when other requests are ready to be executed at the head of any of the drive queues.

POST PROCESSOR TASK

When a data transfer completes, the post processor task is invoked to perform various post processing operations. When the post processor task completes post processing a task, it searches through the parity channel queue and the fcfs queue to determine if either of these queues contain any requests. If so, the post processor task initiates a transfer of the request at the head of the respective queue. If the parity channel queue and the fcfs queue do not contain any requests, then the post processor task completes, and the dequeue task resumes operation and initiates transfer of subsequent requests in the respective drive queues as described above.

Referring now to FIGS. 11A-G, a flowchart diagram illustrating operation of the post processor task is shown. When a request completes in step 740, then in step 742 the task determines if the operation was a PW RAM operation. If so, the post processor task performs various post-processing operations, depending on what type of request or operation was performed. In step 746 the task advances to the next operation state of the respective request. Each request includes one or more operation states. For example, a PW RAM read only includes one state, a data transfer from the PW RAM to the host. A PW RAM flush includes three states, these being a transfer from the PW RAM 71 to the controller transfer buffer RAM 46, a write from the controller transfer buffer RAM 46 to the drive array A, and a status update from the processor 30 to the PW RAM 71. A posted write includes two operation states, these being the data transfer from the processor 30 to the PW RAM 71 and the status update to the PW RAM 71.

In step 748, the task determines the type of operation or request that was performed. If the operation was a configuration update in step 748, then in step 752 the task marks the PW RAM 71 inactive. A configuration update involves writing a new configuration or identification signature to the PW RAM 71. The PW RAM 71 is marked inactive because a configuration update only has one state, which will already have completed by step 750. Upon completion of step 752, the task advances to step 910.

If the operation is a read hit in step 748, then in step 762 (FIG. 11B) the task determines if a read error occurred to the PW RAM 71 on the read, the read having previously completed before this task was invoked. If so, then in step 764 the task logs the error and in step 766 the task determines if the read operation was a read from the mirrored portion of the PW RAM 71. If so, then the task generates a fatal error signal in step 768, which disables posting. If the read was not from the mirrored portion of the PW RAM 71 in step 766, then in step 770 the task returns to the previous operation state, which in this instance is the read operation. In step 772 the task marks the request as a mirrored read and in step 774 initiates the request. This request generates a read from the mirrored portion of the PW RAM 71. Upon completion of step '774, the task returns to step 740. It is noted here that the task will again advance through steps 740-748, and the operation will again be determined to be a read hit in step 748. If this read generates an error as determined in step 762, then in step 766 the determination of whether the read was a mirrored read will be true and the task will advance to step 768 and generate a fatal error.

If a read error was determined to not have occurred in step 762, then in step 776 the task disables locking of the respective line and in step 778 the task deactivates the PW RAM 71. Upon completion of step 778 or step 768, the task advances to step 910

If the respective request is determined to be a posted write in step 748, then in step 782 (FIG. 11C) the task determines the operation state of the posted write. If the posted write is in operation state 1, meaning that the write has just completed, then in step 786 the task determines if the write operation involved an error. If so, then the PW RAM 71 is marked inactive in step 788, and in step 790 the error is logged and the volume is marked as failed. If an error did not occur in step 786, then a status update to the PW RAM 71 is performed, as described below, which includes marking the respective sectors involved in the write both valid and dirty.

In step 882 (FIG. 11D), the task determines if the line has already been dirtied, i.e., if the line already contains dirty sectors. If not, then in step 884, the task increments a counter which counts the number of dirty lines for each of the respective lines in a set. A set comprises the corresponding lines across each of the 15 ways of the PW RAM 71, and thus a set comprises 15 lines from each of the respective ways of the PW RAM 71. If the number of dirty lines counted by the counter is greater than or equal to a certain threshold in step 886, then the task advances to step 888. In the preferred embodiment, the threshold is set equal to full or 15 lines.

In step 888, the task increments a counter for the number of full sets in the PW RAM 71. In step 890, the task disables write posting to the PW RAM. This is done because, when one set in the PW RAM is completely filled, it is determined that there are a large number of dirty lines in the PW RAM 71 which require flushing, and thus further writes to the PW RAM 71 are disabled. Upon completion of step 890, or if the dirty line counter was not greater than or equal to the threshold in step 886, or if the line had already been dirtied in step 882, then in step 892 the task marks the sectors in the line as dirty and valid. The task also unlocks the line to indicate that the posted write has completed.

In step 894, the task sets the dirty lines flag. As previously discussed, the dirty lines flag is used by the flush task to determine if more lines have been dirtied in the PW RAM 71. In step 896, the task enables the flush task at the current line if the flush task is not already running. In step 898, the task marks the request as a status update and in step 900 the task initiates transfer of the respective status information to the PW RAM 71. Upon completion of step 900, the task returns to step 740 and waits for the respective operation to complete. Here it is noted that after the drive operation completes the task will advance to the next operation state in step 746 and then the operation state will be 0 in step 782.

Referring again to FIG. 11C, if the operation state is 0 in step 782, meaning that the status information has already been updated, then the task advances to step 800. In step 800, the task marks the PW RAM 71 inactive and advances to step 910 to initiate other requests. It is noted that if the operation state was determined to be 1 in step 782 and the task performs the operation of transmitting the status in step 900 and then returns to step 740, the next traversal through this sequence results in the task determining the operation state to be 0 in step 782.

Referring again to FIG. 11A, if the current request is determined to be a PW RAM flush request in step '748, then in step 812 (FIG. 11E) the task determines the operation state of the flush. If the operation state is determined to be 2 in step 812, then in step 816 (FIG. 11F) the task determines if a read error occurred in the processor read from the PW RAM 71. It is noted that in a PW RAM flush operation, the processor 30 will read the data from the PW RAM 71, generate any data guard information, i.e., parity writes or mirrored writes, if applicable, and then write this data to the drive array A.

If a read error did occur in reading the flush data from the PW RAM 71 in step 816, then in step 818, the task logs the error and in step 820 determines if the read occurred from the mirrored portion of the PW RAM 71. If so, then a fatal error is generated in step 822, write posting is disabled, and the task then advances to step 910. If the read was not from the mirrored portion of the PW RAM 71 in step 820, then in step 824 the task restores the previous operation state in step 824 and marks the request as a mirrored request in step 826. In step 828 the task initiates a read request from the mirrored side of the PW RAM 71 and returns to step 740.

If a read error did not occur in the PW RAM 71 in step 816, then in step 830 the task marks the PW RAM 71 inactive. In step 832 the task restores the original command or request to a write operation. As previously discussed, in step 384 of the scheduler task, when the scheduler task had determined that the request was a flush request, it changed the request from a write to a read in order to retrieve the data from the PW RAM 71. In step 832, the post processor task restores the request to a write to now write the flush data to the drive array A.

In step 834 the task determines if the request requires data guard operations. If so, then in step 836, the task frees the channel for the upcoming data guard operations and in step 838 frees up the destination drive. In step 840 the task initiates the respective data guard operation required as well as the data writes and then advances to step 910. If the PW RAM flush operation does not include data guard requests in step 834, then in step 842 the task writes the data retrieved from the PW PAM 71 to the drive array A and returns to step 740. When the operation completes in step 740, then the task advances to the next operation state in step 746, and thus the operation state will be 1 the next time step 812 is executed.

Referring again to FIG. 11E, if the flush operation state is determined to be 1 in step 812, then in step 852 the task determines if a drive error occurred on the write operation to the drive array A. If not, then in step 854 the task marks the respective sectors clean and marks the request as a status update in step 856. In step 858 the task determines if the PW RAM 71 is inactive. If so, then the task initiates the status transfer in step 860 and returns to step 740. The next time step 812 is executed the operation state will be 0.

Figure 11A:
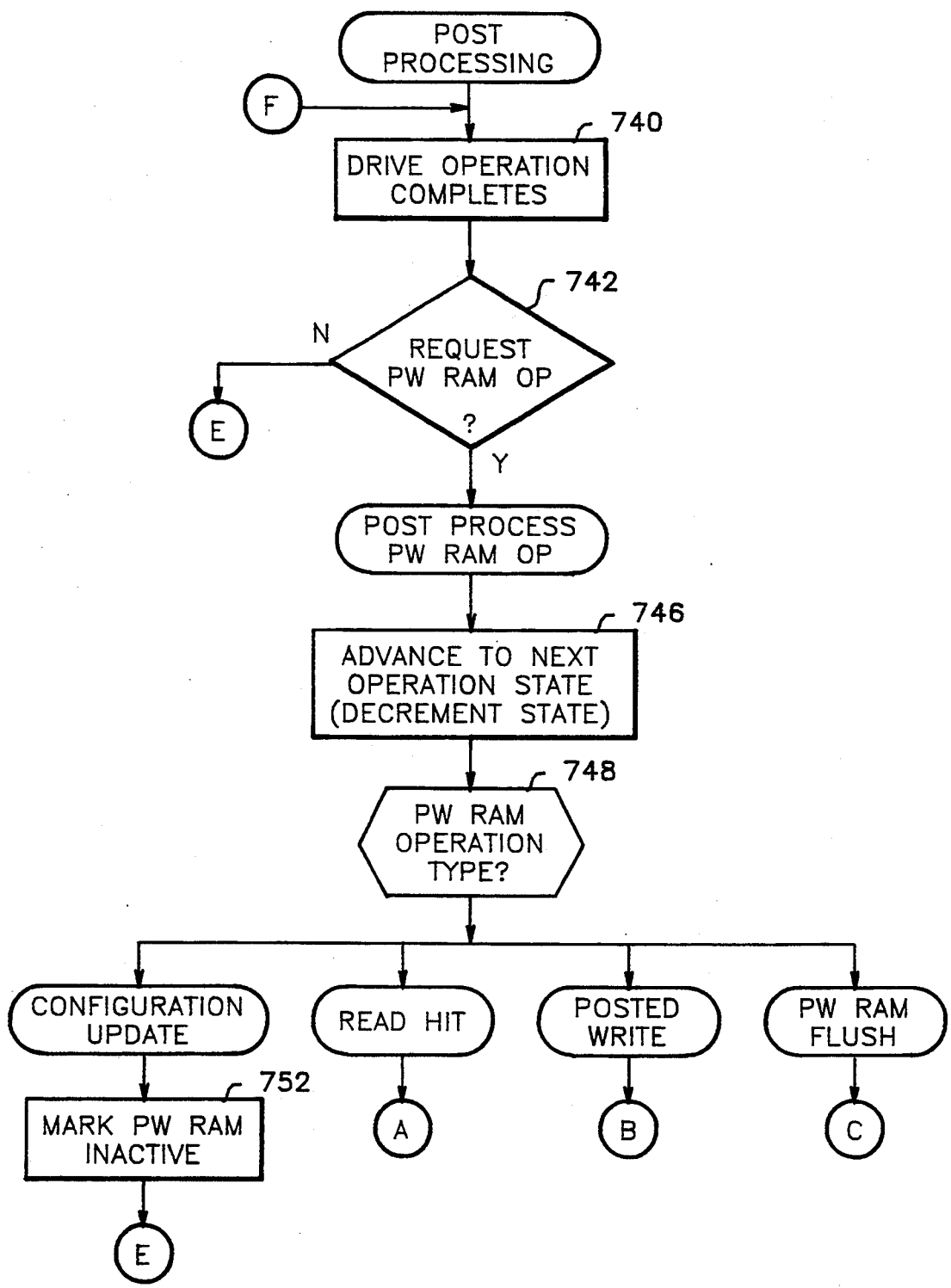
Figure 11B:
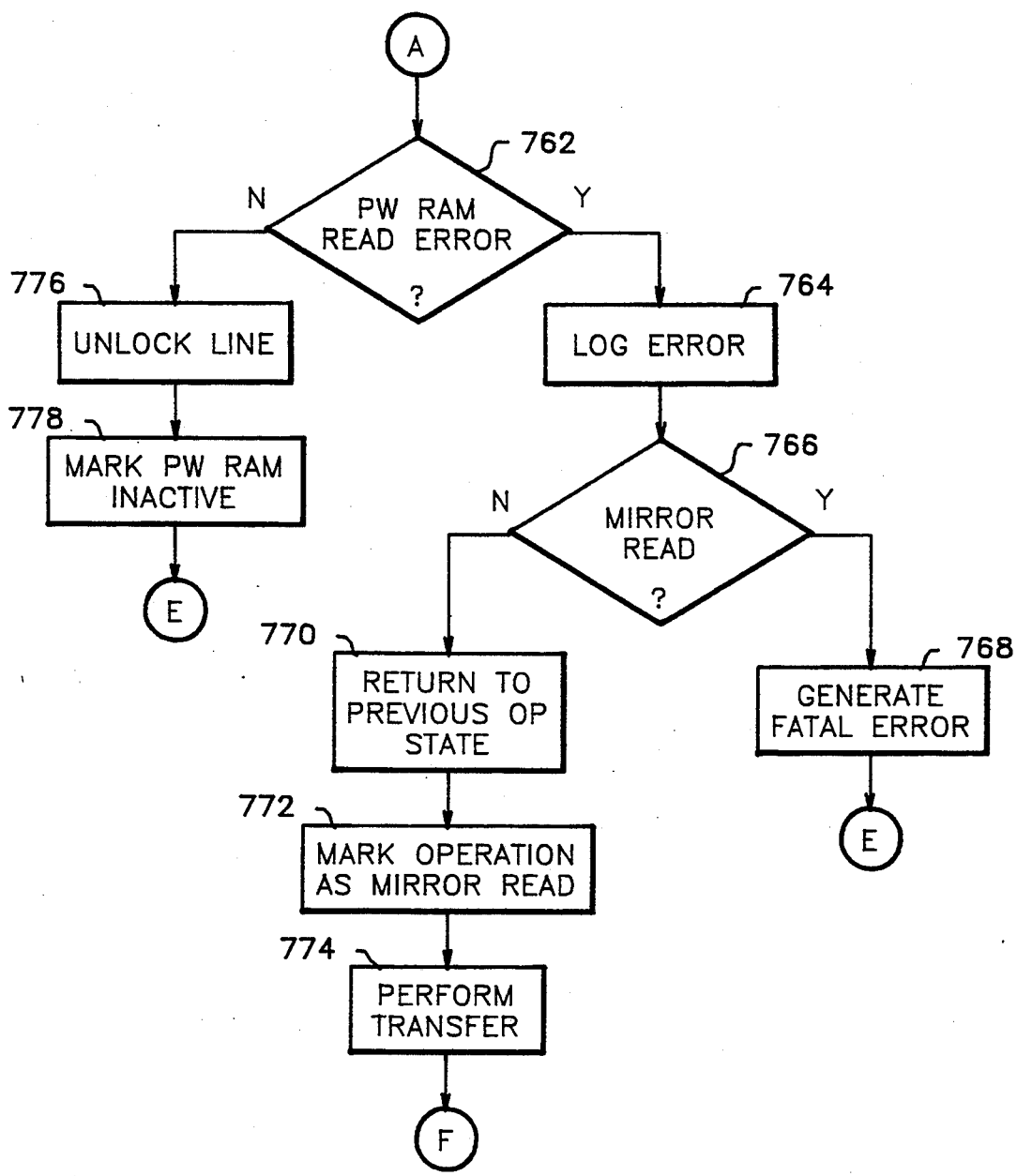
Figure 11C:
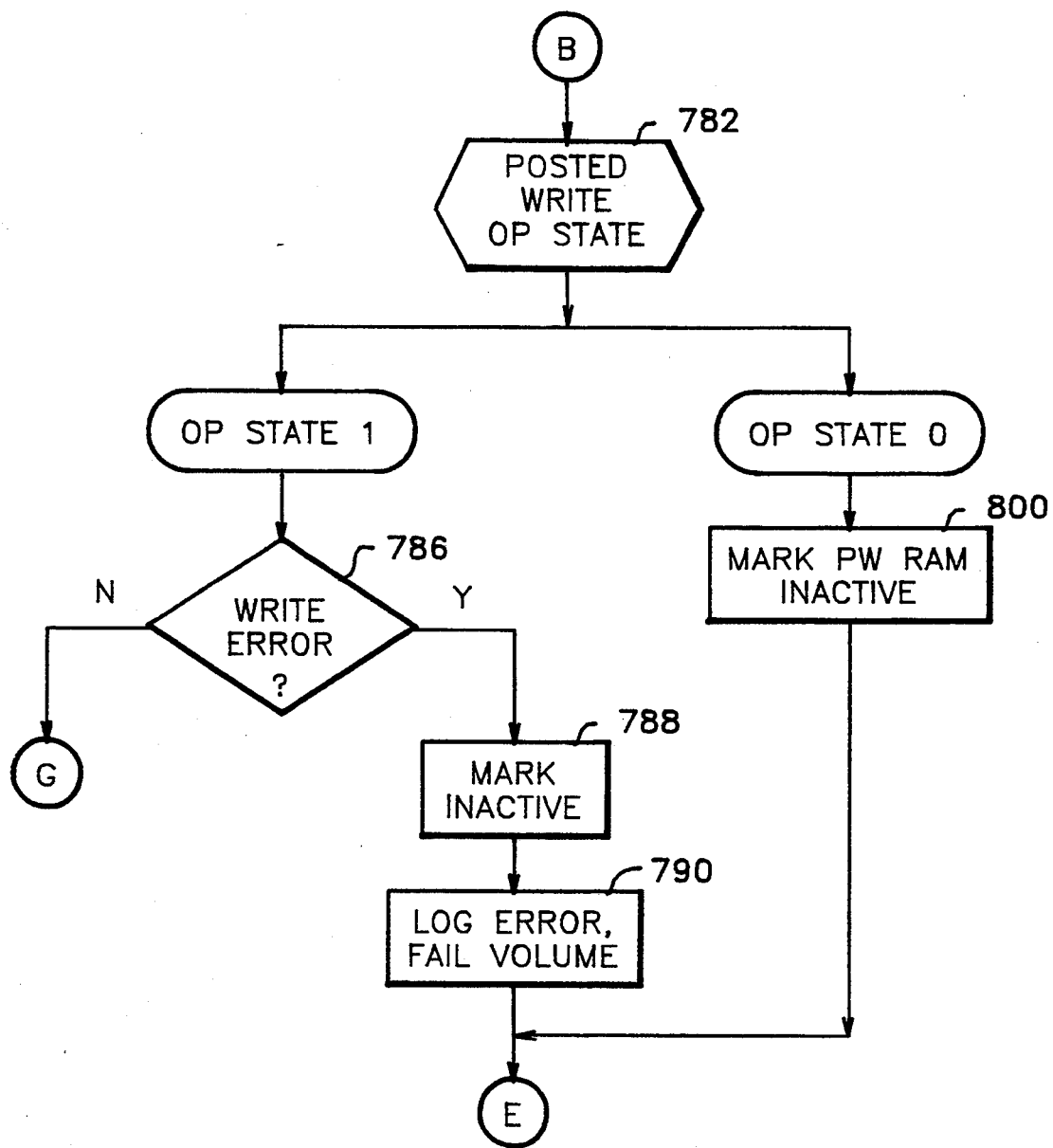
Figure 11D:
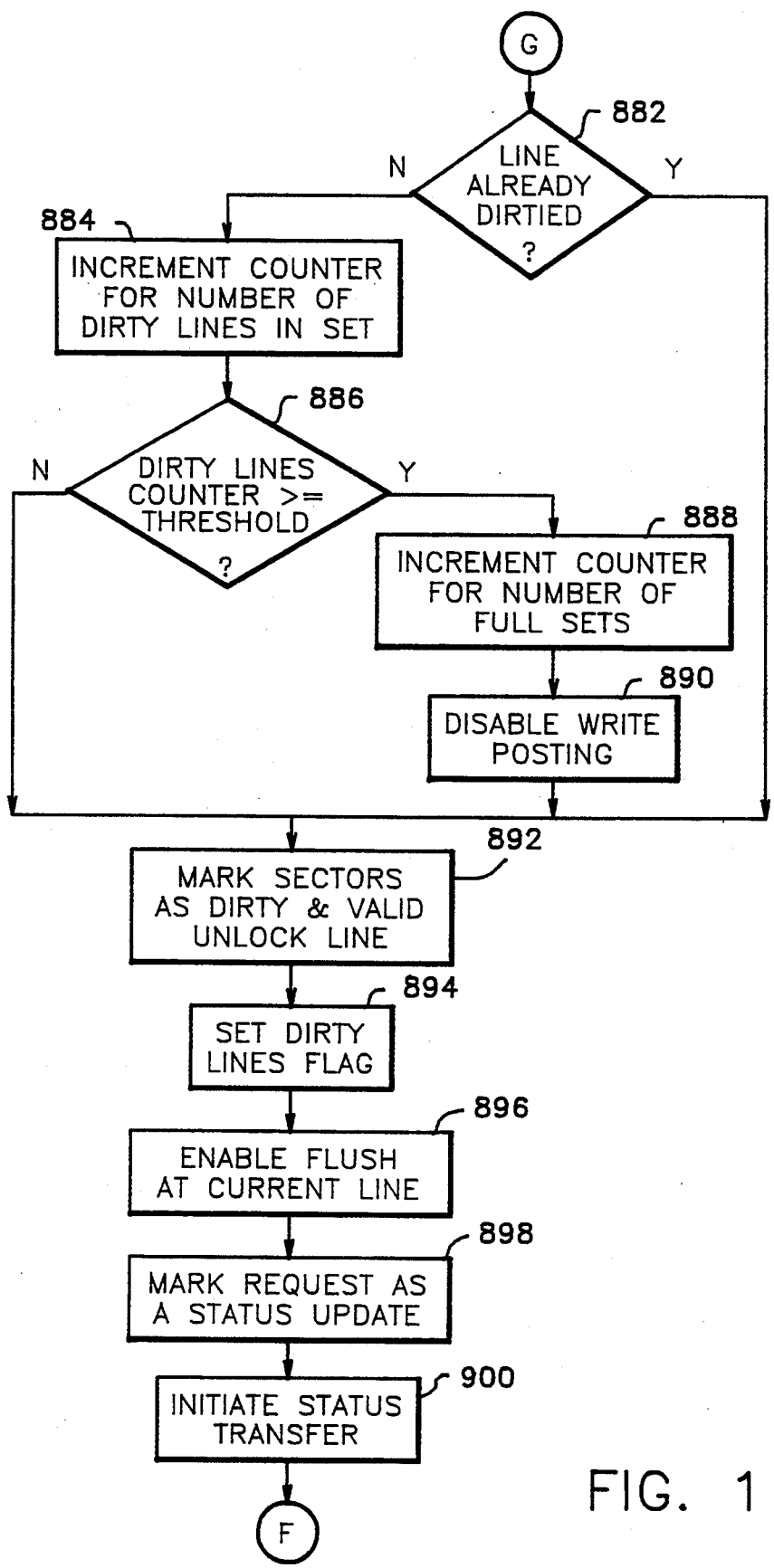
Figure 11E:
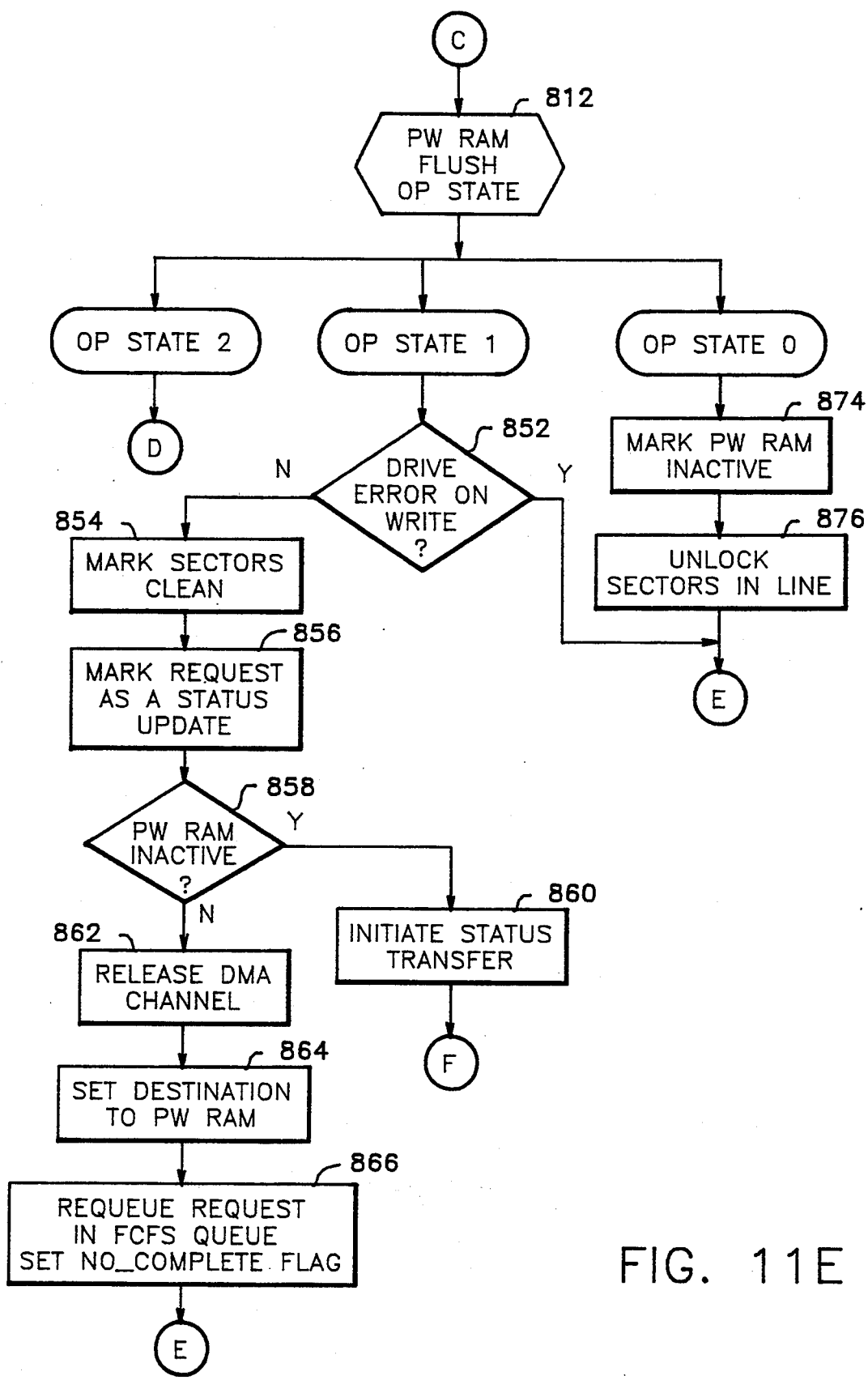
Figure 11F:
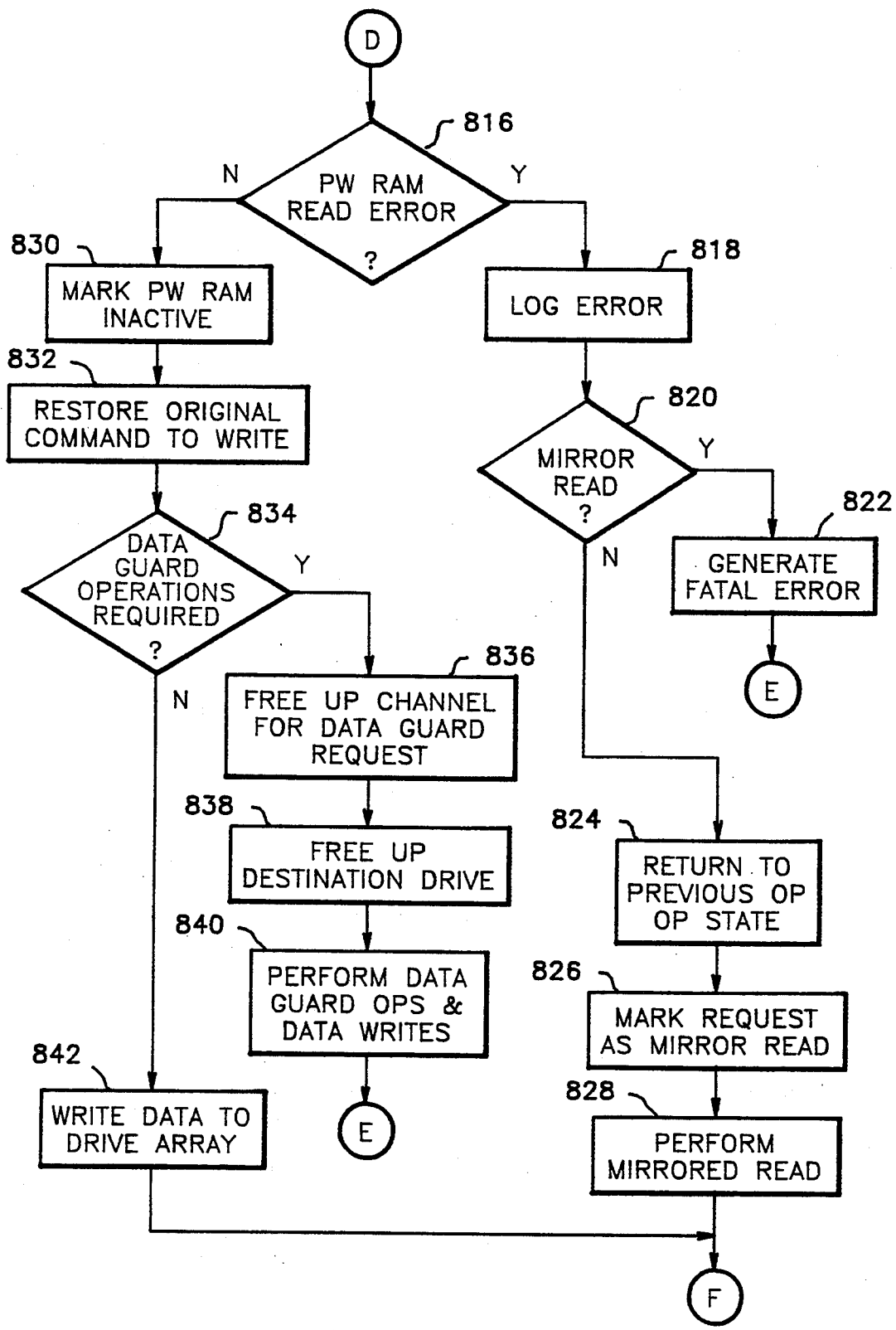
Figure 11G:
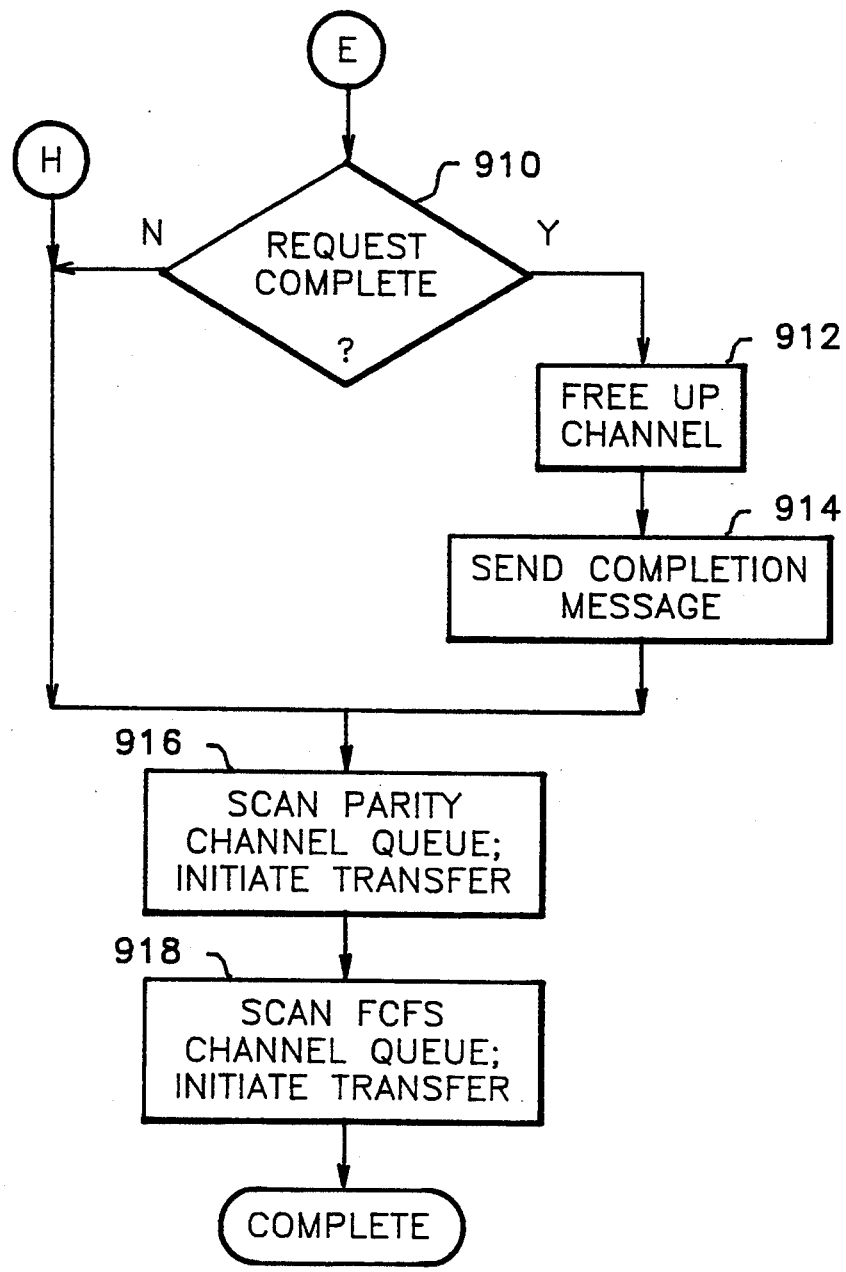

If the PW RAM 71 is determined to be active in step 858, then in step 862 the task releases the DMA channel and in step 864 sets the destination of the request to the PW RAM 71. In step 866 the task requeues the request to the fcfs queue and then advances to step 910 (FIG. 11G). If a drive error was determined to have occurred on the write operation in step 852, then the task advances to step 910. No attempt is made to fix the drive error in this task, but rather remap operations that are performed on the drive array A are designated to fix this occurrence. If the operation state in step 812 is determined to be 0, then in step 874 the task marks the PW RAM 71 inactive. In step 876 the task unlocks the line to indicate that the flush has completed.

Referring now to FIG. 11G, in step 910 the task determines if the operation has completed. If so, then in step 912 the task frees up the respective channel and sends a completion message in step 914. It is noted that the task will determine in step 910 that the operation has not completed if the task arrives here from step 866. This is because the PW RAM 71 was busy in step 858 and thus the request was requeued in step 866. Upon completion of step 914, or if the operation had not completed in step 910, in step 916 the task scans the parity channel queue for requests and initiates a transfer if the queue contains requests. In step 918 the task scans the fcfs queue for requests and initiates a transfer if the queue contains requests. When either of these requests completes, then the post processor task is again invoked to perform any post processing required. If the parity channel queue and the drive queue do not contain any requests, then the post processor task completes and the dequeue task is invoked. The dequeue task initiates other transfers from requests at the head of the respective drive queues. When these requests complete, the post processor task is invoked to perform post processing as described above. This sequence of operations completes to perform the various data, parity, and status transfers between the PW RAM 71, the host, and the drive array A.

CONCLUSION

Therefore, a posted write memory which operates in conjunction with a drive array is disclosed. A task referred to as the flush task continually scans the PW RAM 71, coalesces partial stripe writes into full stripe writes, and builds logical requests in a way similar to the manner in which a host such as the computer processor builds a command list. The flush logical request is executed in a similar manner to the logical requests in a host command list. In addition, if the PW RAM 71 becomes full, it delays partial stripe writes, but allows full stripe writes or greater to pass directly to the drive array A, thus increasing system efficiency.

The foregoing disclosure and description of the invention are illustrative and explanatory thereof, and various changes in the size, shape, materials, components, circuit elements, and wiring connections, as well as in the details of the illustrated circuitry and construction and method of operation may be made without departing from the spirit of the invention.

We claim:

1. An apparatus for improving performance in a disk array, wherein the disk array includes parity fault tolerance and a plurality of stripes for storing data, the apparatus comprising:

a posting memory coupled to the disk array which receives and stores host write data intended for the disk array provided by host write operations, wherein said host write operations comprise partial stripe writes;

flushing means coupled to said posting memory for monitoring said host write data stored in said posting memory and for generating write requests comprising said host write data including one or more full stripe write operations; and means coupled to said flushing means, said posting memory, and the disk array for receiving said write requests generated by the flushing means and for executing said write requests to the disk array, wherein said flushing means coalesces continuous partial stripe writes and incorporates said coalesced partial stripe writes into said full stripe write operation write requests.

2. The apparatus of claim 1, wherein said posting memory is organized into a plurality of sequential lines storing host write data; and wherein said flushing means sequentially examines said lines storing host write data and incorporates sequential lines including dirty data that can be flushed into said full stripe write operation write requests.

3. The apparatus of claim 2, wherein the drive array is comprised of one or more logical volumes and host write data has a destination in one of said logical volumes, wherein groups of said posting memory lines correspond to respective stripes in the disk array, each of said groups including a first line corresponding to the beginning of its corresponding stripe in the disk array and a last line corresponnding to the end of its corresponding stripe in the disk array;

wherein said flushing means determines the logical volume destination of host write data in said posting memory prior to examining said plurality of sequential lines; and wherein said flushing means begins examining said plurality of sequential lines at the first line in a group corresponding to a respective stripe if said logical volume destination includes parity fault tolerance.

4. The apparatus of claim 3, wherein if said flushing means begins examining a line other than the first line in said group corresponding to said respective stripe, said flushing means backs up and begins examining the first line in said group if said logical volume destination includes parity fault tolerance.

5. The apparatus of claim 2, wherein groups of said posting memory lines correspond to respective stripes in the disk array;

wherein said flushing means examines sequential lines and incorporates said sequential lines into said write request until said flushing means examines a line which does not include data that can be flushed.

6. The apparatus of claim 5, further comprising:

means for storing status information pertaining to each of said plurality of sequential lines in said posting memory;

wherein said flushing means is compled to said status information storing means and examines said status information pertaining to a respective line to determine whether to incorporate said respective line into said write request.

7. An apparatus for improving performance in a disk array, wherein the disk array includes parity fault tolerance and a plurality of stripes for storing data, the apparatus comprising:

a posting memory coupled to the disk array which receives and stores host write data intended for the disk array provided by host write operations wherein said host write operations comprise partial stripe writes;

flushing means coupled to said posting memory for monitoring said host write data stored in said posting memory and for generating write requests comprising said host write data including one or more full strips write operations; and means coupled to said flushing means, said posting memory, and the disk array for receiving said write request generated by the flushing means and for executing said write requests to the disk array;

wherein said flushing means includes means for determining if said posting memory includes no dirty data; and wherein said flushing means; discontinues operations when said determining means determines that said posting memory includes no dirty data.

8. The apparatus of claim 7, further comprising:

a main power source coupled to said posting memory; and battery back-up means coupled to said posting memory which supplies power to said posting memory if said main power source discontinues providing power; and wherein said flushing means disables operation of said battery back-up means if said determining means determines that said posting memory includes no dirty data.

9. A method for improving disk array performance utilizing a posting memory coupled to the disk array, wherein the disk array includes parity fault tolerance and a plurality of stripes for storing data, the method comprising:

receiving host write operations, wherein said host write operations include partial stripe writes;

storing said host write operations in the posting memory;

coalescing contiguous partial stripe writes into full stripes or greater; and writing said coalesced partial stripe writes to the drive array as one or more full stripe writes.

10. The method of claim 9, wherein the posting memory includes a plurality of groups of lines storing data corresponding to respective stripes in the disk array, each of said lines storing data corresponding to a plurality of sectors on a drive in the drive array including a first sector and a last sector, wherein said step of coalescing comprises:

a) examining a line corresponding to a first stripe to determine if the line includes dirty data that can be flushed;

b) determining if the last sector in said line being examined contains dirty data that can be flushed;

c) advancing to step h) if the last sector in said line being examined does not include dirty data that can be flushed in step b);

d) examining the line subsequent to said line being examined if the last sector in said line being examined includes dirty data than can be flushed in step b) and said subsequent line is present, said subsequent line now becoming the line being examined;

e) determining if the first sector in said line being examined contains dirty data that can be flushed if said line being examined is present;

f) coalescing the dirty sectors in said line being examined with prior examined lines if the first sector in said line being examined includes dirty data that can be flushed and said line being examined is present;

g) examining the line subsequent to said line being examined and returning to step (e) if said line being examined is present and all of the data in said line being examined includes dirty data that can be flushed and said subsequent line is present, said subsequent line now becoming the line being examined; and h) assembling a write request comprising the dirty sectors of said examined lines; and wherein said step of writing comprises executing said write request to the drive array.

11. A method for flushing data from a posting memory to a disk array which includes a plurality of stripes storing data and parity fault tolerance, wherein the posting memory includes a plurality of groups of lines storing data corresponding to respective stripes in the disk array, each of said lines including data corresponding to a plurality of sectors on a drive in the drive array, each of said lines including data corresponding to a first sector and a last sector, the method comprising:
- a) examining a line corresponding to a first stripe to determine if the line includes dirty data that can be flushed;
- b) determining if the last sector in said line being examined contains dirty data that can be flushed;
- c) advancing to step h) if the last sector in said line being examined does not include dirty data that can be flushed in step b);
- d) examining the line subsequent to said line being examined if the last sector in said line being examined includes dirty data than can be flushed in step b) and said subsequent line is present, said subsequent line now becoming the line being examined;
- e) determining if the first sector in said line being examined contains dirty data that can be flushed if said line being examined is present;
- f) coalescing the dirty sectors in said line being examined with prior examined lines if the first sector in said line being examined includes dirty data that can be flushed and said line being examined is present;
- g) examining the line subsequent to said line being examined and returning to step (e) if said line being examined is present and all of the data in said line being examined includes dirty data that can be flushed and said subsequent line is present, said subsequent line now becoming the line being examined; and
- h) assembling a write request comprising the dirty sectors of said examined lines.

12. A method for flushing data from a posting memory to a disk array which includes a plurality of stripes storing data and parity fault tolerance, wherein each of the stripes includes a plurality of sectors and wherein the posting memory includes a plurality of groups of lines storing data corresponding to stripes in the disk array, wherein each of said groups may store a first line corresponding to the beginning of its corresponding stripe in the disk array and a last line corresponnding to the end of its corresponding stripe in the disk array, each of said lines corresponding to a plurality of sectors on a drive in the drive array including a first sector and a last sector, the method comprising:
- a) examining a middle line corresponding to a stripe to determine if the line contains dirty data that can be flushed;
- b) determining if parity fault tolerance is being implemented on the volume including said stripe;
- c) locating the first line corresponding to the beginning of said stripe if parity fault tolerance is being implemented on the volume including said stripe, said middle line being examined is not said first line, and said first line is present;
- d) determining if said first line corresponding to the beginning of said stripe includes dirty data that can be flushed after said step of locating if said first line is located in step c);
- e) coalescing dirty sectors in said first line as well as subsequent lines into a write request and advancing to step (i) if said first line is present and includes dirty data that can be flushed;
- f) returning to said middle line if said first line is not present or does not include dirty data that can be flushed;
- g) examining said middle line after said step of returning if said first line is not present or does not include dirty data than can be flushed;
- h) coalescing dirty sectors in said middle line as well as subsequent lines into a write request after executing steps f) and g); and
- i) generating a write request comprising said coalesced dirty sectors.

13. An apparatus for improving performance in a disk array which includes a plurality of stripes for storing data and parity fault tolerance, wherein writes intended for the disk array include corresponding write data having a given size, the apparatus comprising:
- a disk array;
- a posting memory receiving and storing said disk array write data;
- means for delaying storing of write data corresponding to a disk array write if said posting memory is full and said write data is less than a first size; and
- means for writing disk array write data directly to the drive array if said posting memory is full and said write data is greater than or equal to said first size; and
- wherein said write data greater than or equal to said first size is not written to said posting memory.

14. The apparatus of claim 13, wherein said first size is equivalent to a full stripe write if the drive array is using parity fault tolerance.

15. The apparatus of claim 14, further comprising:
- means for delaying storing write data corresponding to a disk array write if said posting memory is full and said write data is less than a second size if the disk array is not using parity fault tolerance;
- means for writing disk array write data directly to the drive array data if the posting memory is full, the disk array is not using parity fault tolerance, and said write data is greater than or equal to said second size;
- wherein said second size is less than said first size.

16. A method for improving performance in a disk array which includes a plurality of stripes for storing data and parity fault tolerance, wherein writes intended for the disk array include corresponding write data having a given size, the method comprising:
- receiving a disk array write request having a certain size and a destination in the disk array;
- determining if the posting memory is full;
- determining if parity fault tolerance is being used in said disk array destination after said step of receiving;
- delaying storing write data corresponding to said disk array write request if said posting memory is full, parity fault tolerance is being used in said disk array destination, and said write data is less than a first size; and
- writing said write data directly to the drive array if said posting memory is full, parity fault tolerance is being used in said disk array destination, and said write data is greater than or equal to said first size.

17. The method of claim 16, further comprising:
  delaying storing said write data if said posting memory is full, parity fault tolerance is not being used in said disk array destination, and said write data is less than a second size; and
  writing said write data directly to the drive array if said posting memory is full, parity fault tolerance is not being used in said disk array destination, and said write data is greater than or equal to said second size;
  wherein said second size is less than said first size.

18. A method for improving performance in a disk array which includes a plurality of stripes for storing data and parity fault tolerance, wherein writes intended for the disk array include corresponding write data having a given size, the method comprising:
  delaying storing write data corresponding to a disk array write if said posting memory is full and said write data is less than a first size;
  writing directly to the drive array write data corresponding to a disk array write if said posting memory is full and said write data is greater than or equal to said first size.

19. The method of claim 18, wherein said first size is equivalent to a full stripe write if the drive array is using parity fault tolerance.

20. The method of claim 19, wherein said step of delaying delays storing write data corresponding to a disk array write if said posting memory is full and said write data is less than a second size if the disk array is not using parity fault tolerance;
  wherein said step of directly writing writes directly to the drive array write data corresponding to a disk array write if said posting memory is full and said write data is greater than or equal to said second size if the disk array is not using parity fault tolerance; and
  wherein said second size is less than said first size.

* * * * *

UNITED STATES PATENT AND TRADEMARK OFFICE
CERTIFICATE OF CORRECTION

PATENT NO. : 5,408,644
DATED : April 18, 1995
INVENTOR(S) : Randy D. Schneider et al.

It is certified that error appears in the above-identified patent and that said Letters Patent is hereby corrected as shown below:

In col. 34, line 6, please delete ";".

Signed and Sealed this

Third Day of October, 1995

*Attest:*

BRUCE LEHMAN

*Attesting Officer*      *Commissioner of Patents and Trademarks*

UNITED STATES PATENT AND TRADEMARK OFFICE
CERTIFICATE OF CORRECTION

PATENT NO. : 5,408,644
DATED : April 18, 1995
INVENTOR(S) : Randy D. Schneider et al.

It is certified that error appears in the above-identified patent and that said Letters Patent is hereby corrected as shown below:

Column 5,
Line 52, delete "FIGS. 5 s" and insert -- FIG. 5 is --.

Column 33,
Line 18, delete "corresponnding" and insert -- corresponding --.
Line 48, delete "compled" and insert -- completed --.
Line 66, delete "strips" and insert -- stripes --.

Column 35,
Line 52, delete "corresponnding" and insert -- corresponding --.

Signed and Sealed this

Seventh Day of February, 2006

JON W. DUDAS
*Director of the United States Patent and Trademark Office*